United States Patent
Bokma et al.

(10) Patent No.: US 9,494,627 B1
(45) Date of Patent: *Nov. 15, 2016

(54) TOUCH DETECTION TECHNIQUES FOR CAPACITIVE TOUCH SENSE SYSTEMS

(75) Inventors: Louis W. Bokma, Newark, CA (US);
Andrew C. Page, Mukilteo, WA (US);
Dennis R. Seguine, Monroe, WA (US)

(73) Assignee: MONTEREY RESEARCH, LLC, Santa Clara, CA (US)

( * ) Notice: Subject to any disclaimer, the term of this patent is extended or adjusted under 35 U.S.C. 154(b) by 447 days.

This patent is subject to a terminal disclaimer.

(21) Appl. No.: 13/590,390

(22) Filed: Aug. 21, 2012

Related U.S. Application Data

(63) Continuation of application No. 13/047,620, filed on Mar. 14, 2011, now Pat. No. 8,248,084, which is a continuation of application No. 11/729,818, filed on Mar. 28, 2007, now Pat. No. 8,040,142.

(60) Provisional application No. 60/788,127, filed on Mar. 31, 2006.

(51) Int. Cl.
*G01R 27/26* (2006.01)
*G06F 3/041* (2006.01)
*G06F 3/044* (2006.01)

(52) U.S. Cl.
CPC ........... *G01R 27/2605* (2013.01); *G06F 3/041* (2013.01); *G06F 3/044* (2013.01)

(58) Field of Classification Search
USPC .......................................... 324/658; 345/173
See application file for complete search history.

(56) References Cited

U.S. PATENT DOCUMENTS

| | | | |
|---|---|---|---|
| 3,921,167 A | 11/1975 | Fox | |
| 3,979,745 A | 9/1976 | Bishop | |
| 4,103,252 A | 7/1978 | Bobick | |
| 4,113,378 A | 9/1978 | Wirtz | |
| 4,193,063 A | 3/1980 | Hitt et al. | |
| 4,238,711 A | 12/1980 | Wallot | |
| 4,264,903 A | 4/1981 | Bigelow | |
| 4,266,144 A | 5/1981 | Bristol | |
| 4,283,713 A | 8/1981 | Philipp | |
| 4,292,604 A | 9/1981 | Embree et al. | |

(Continued)

FOREIGN PATENT DOCUMENTS

| | | |
|---|---|---|
| EP | 0574213 A | 12/1993 |
| GB | 05000604 B2 | 2/2005 |
| WO | 0002188 A | 1/2000 |

OTHER PUBLICATIONS

USPTO Notice of Allowance for U.S. Appl. No. 11/729,818 dated Nov. 13, 2009; 7 pages.

(Continued)

*Primary Examiner* — Jeff Natalini
(74) *Attorney, Agent, or Firm* — Kunzler Law Group, PC

(57) ABSTRACT

A technique for recognizing and rejecting false activation events related to a capacitance sense interface includes measuring a capacitance value of a capacitance sense element. The measured capacitance value is analyzed to determine a baseline capacitance value for the capacitance sensor. The capacitance sense interface monitors a rate of change of the measured capacitance values and rejects an activation of the capacitance sense element as a non-touch event when the rate of change of the measured capacitance values have a magnitude greater than a threshold level, indicative of a maximum rate of change of a touch event.

19 Claims, 11 Drawing Sheets

(56) References Cited

U.S. PATENT DOCUMENTS

| | | |
|---|---|---|
| 4,305,135 A | 12/1981 | Dahl et al. |
| 4,438,404 A | 3/1984 | Philipp |
| 4,475,151 A | 10/1984 | Philipp |
| 4,497,575 A | 2/1985 | Philipp |
| 4,560,830 A | 12/1985 | Perl |
| 4,586,260 A | 5/1986 | Baxter et al. |
| 4,736,097 A | 4/1988 | Philipp |
| 4,736,191 A | 4/1988 | Matzke et al. |
| 4,742,331 A | 5/1988 | Barrow et al. |
| 4,772,983 A | 9/1988 | Kerber et al. |
| 4,773,024 A | 9/1988 | Faggin et al. |
| 4,802,103 A | 1/1989 | Faggin et al. |
| 4,825,147 A | 4/1989 | Cook et al. |
| 4,831,325 A | 5/1989 | Watson, Jr. |
| 4,876,534 A | 10/1989 | Mead et al. |
| 4,878,013 A | 10/1989 | Andermo |
| 4,879,461 A | 11/1989 | Philipp |
| 4,879,508 A | 11/1989 | Andermo |
| 4,935,702 A | 6/1990 | Mead et al. |
| 4,940,980 A | 7/1990 | Tice |
| 4,953,928 A | 9/1990 | Anderson et al. |
| 4,962,342 A | 10/1990 | Mead et al. |
| 4,977,480 A | 12/1990 | Nishihara |
| 5,008,497 A | 4/1991 | Asher |
| 5,049,758 A | 9/1991 | Mead et al. |
| 5,055,827 A | 10/1991 | Philipp |
| 5,059,920 A | 10/1991 | Anderson et al. |
| 5,068,622 A | 11/1991 | Mead et al. |
| 5,073,759 A | 12/1991 | Mead et al. |
| 5,083,044 A | 1/1992 | Mead et al. |
| 5,095,284 A | 3/1992 | Mead |
| 5,097,305 A | 3/1992 | Mead et al. |
| 5,107,149 A | 4/1992 | Platt et al. |
| 5,109,261 A | 4/1992 | Mead et al. |
| 5,119,038 A | 6/1992 | Anderson et al. |
| 5,120,996 A | 6/1992 | Mead et al. |
| 5,122,800 A | 6/1992 | Philipp |
| 5,126,685 A | 6/1992 | Platt et al. |
| 5,146,106 A | 9/1992 | Anderson et al. |
| 5,160,899 A | 11/1992 | Anderson et al. |
| 5,165,054 A | 11/1992 | Platt et al. |
| 5,166,562 A | 11/1992 | Allen et al. |
| 5,204,549 A | 4/1993 | Platt et al. |
| 5,214,388 A | 5/1993 | Vranish et al. |
| 5,237,879 A | 8/1993 | Speeter |
| 5,243,554 A | 9/1993 | Allen et al. |
| 5,248,873 A | 9/1993 | Allen et al. |
| 5,260,592 A | 11/1993 | Mead et al. |
| 5,270,963 A | 12/1993 | Allen et al. |
| 5,276,407 A | 1/1994 | Mead et al. |
| 5,281,862 A | 1/1994 | Ma |
| 5,289,023 A | 2/1994 | Mead |
| 5,294,889 A | 3/1994 | Heep et al. |
| 5,303,329 A | 4/1994 | Mead et al. |
| 5,305,017 A | 4/1994 | Gerpheide |
| 5,324,958 A | 6/1994 | Mead et al. |
| 5,331,215 A | 7/1994 | Allen et al. |
| 5,336,936 A | 8/1994 | Allen et al. |
| 5,339,213 A | 8/1994 | O'Callaghan |
| 5,349,303 A | 9/1994 | Gerpheide |
| 5,373,245 A | 12/1994 | Vranish et al. |
| 5,374,787 A | 12/1994 | Miller et al. |
| 5,381,515 A | 1/1995 | Platt et al. |
| 5,384,467 A | 1/1995 | Plimon et al. |
| 5,386,219 A | 1/1995 | Greanias et al. |
| 5,408,194 A | 4/1995 | Steinbach et al. |
| 5,424,756 A | 6/1995 | Ho et al. |
| 5,488,204 A | 1/1996 | Mead et al. |
| 5,495,077 A | 2/1996 | Miller et al. |
| 5,518,078 A | 5/1996 | Tsujioka et al. |
| 5,525,980 A | 6/1996 | Jahier et al. |
| 5,541,580 A | 7/1996 | Gerston et al. |
| 5,541,878 A | 7/1996 | Lemoncheck et al. |
| 5,543,588 A | 8/1996 | Bisset et al. |
| 5,543,590 A | 8/1996 | Gillespie et al. |
| 5,543,591 A | 8/1996 | Gillespie et al. |
| 5,555,907 A | 9/1996 | Philipp |
| 5,565,658 A | 10/1996 | Gerpheide et al. |
| 5,566,702 A | 10/1996 | Philipp |
| 5,572,205 A | 11/1996 | Caldwell et al. |
| 5,629,891 A | 5/1997 | Lemoncheck et al. |
| 5,648,642 A | 7/1997 | Miller et al. |
| 5,670,915 A | 9/1997 | Cooper et al. |
| 5,672,959 A | 9/1997 | Der |
| 5,680,070 A | 10/1997 | Anderson et al. |
| 5,682,032 A | 10/1997 | Philipp |
| 5,684,487 A | 11/1997 | Timko |
| 5,691,513 A | 11/1997 | Yamamoto et al. |
| 5,730,165 A | 3/1998 | Philipp |
| 5,757,368 A | 5/1998 | Gerpheide et al. |
| 5,763,909 A | 6/1998 | Mead et al. |
| 5,763,924 A | 6/1998 | Lum et al. |
| 5,767,457 A | 6/1998 | Gerpheide et al. |
| 5,796,183 A | 8/1998 | Hourmand et al. |
| 5,812,698 A | 9/1998 | Platt et al. |
| 5,841,078 A | 11/1998 | Miller et al. |
| 5,844,265 A | 12/1998 | Mead et al. |
| 5,854,625 A | 12/1998 | Frisch et al. |
| 5,861,583 A | 1/1999 | Schediwy et al. |
| 5,861,875 A | 1/1999 | Gerpheide |
| 5,864,242 A | 1/1999 | Allen et al. |
| 5,864,392 A | 1/1999 | Winklhofer et al. |
| 5,880,411 A | 3/1999 | Gillespie et al. |
| 5,889,236 A | 3/1999 | Gillespie et al. |
| 5,914,465 A | 6/1999 | Allen et al. |
| 5,914,708 A | 6/1999 | Lagrange et al. |
| 5,920,310 A | 7/1999 | Faggin et al. |
| 5,942,733 A | 8/1999 | Allen et al. |
| 5,943,052 A | 8/1999 | Allen et al. |
| 5,949,264 A | 9/1999 | Lo |
| 5,969,513 A | 10/1999 | Clark |
| 6,023,422 A | 2/2000 | Allen et al. |
| 6,028,271 A | 2/2000 | Gillespie et al. |
| 6,028,959 A | 2/2000 | Wang et al. |
| 6,037,929 A | 3/2000 | Ogura et al. |
| 6,037,930 A | 3/2000 | Wolfe et al. |
| 6,060,957 A | 5/2000 | Kodrnja et al. |
| 6,067,019 A | 5/2000 | Scott |
| 6,097,432 A | 8/2000 | Mead et al. |
| 6,140,853 A | 10/2000 | Lo |
| 6,145,850 A | 11/2000 | Rehm |
| 6,148,104 A | 11/2000 | Wang et al. |
| 6,184,871 B1 | 2/2001 | Teres et al. |
| 6,188,228 B1 | 2/2001 | Philipp |
| 6,188,391 B1 | 2/2001 | Seely et al. |
| 6,191,723 B1 | 2/2001 | Lewis |
| 6,222,528 B1 | 4/2001 | Gerpheide et al. |
| 6,239,389 B1 | 5/2001 | Allen et al. |
| 6,249,447 B1 | 6/2001 | Boylan et al. |
| 6,262,717 B1 | 7/2001 | Donohue et al. |
| 6,271,719 B1 | 8/2001 | Sevastopoulos |
| 6,271,720 B1 | 8/2001 | Sevastopoulos |
| 6,271,835 B1 | 8/2001 | Hoeksma |
| 6,278,283 B1 | 8/2001 | Tsugai |
| 6,280,391 B1 | 8/2001 | Olson et al. |
| 6,288,707 B1 | 9/2001 | Philipp |
| 6,295,052 B1 | 9/2001 | Kato et al. |
| 6,304,014 B1 | 10/2001 | England et al. |
| 6,320,184 B1 | 11/2001 | Winklhofer et al. |
| 6,323,846 B1 | 11/2001 | Westerman et al. |
| 6,326,859 B1 | 12/2001 | Goldman et al. |
| 6,342,817 B1 | 1/2002 | Crofts et al. |
| 6,344,773 B1 | 2/2002 | Sevastopoulos et al. |
| 6,366,099 B1 | 4/2002 | Reddi |
| 6,377,009 B1 | 4/2002 | Philipp |
| 6,377,129 B1 | 4/2002 | Rhee et al. |
| 6,380,929 B1 | 4/2002 | Platt |
| 6,380,931 B1 | 4/2002 | Gillespie et al. |
| 6,414,671 B1 | 7/2002 | Gillespie et al. |
| 6,424,338 B1 | 7/2002 | Anderson |
| 6,430,305 B1 | 8/2002 | Decker |
| 6,441,073 B1 | 8/2002 | Tanaka et al. |
| 6,441,682 B1 | 8/2002 | Vinn et al. |
| 6,445,257 B1 | 9/2002 | Cox et al. |

(56) References Cited

U.S. PATENT DOCUMENTS

| | | |
|---|---|---|
| 6,448,911 B1 | 9/2002 | Somayajula |
| 6,449,195 B1 * | 9/2002 | Min et al. ............... 365/189.05 |
| 6,452,514 B1 | 9/2002 | Philipp |
| 6,457,355 B1 | 10/2002 | Philipp |
| 6,459,321 B1 | 10/2002 | Belch |
| 6,466,036 B1 | 10/2002 | Philipp |
| 6,473,069 B1 | 10/2002 | Gerpheide |
| 6,489,899 B1 | 12/2002 | Ely et al. |
| 6,490,203 B1 | 12/2002 | Tang |
| 6,522,083 B1 | 2/2003 | Roach |
| 6,522,128 B1 | 2/2003 | Ely et al. |
| 6,522,187 B1 | 2/2003 | Sousa |
| 6,534,970 B1 | 3/2003 | Ely et al. |
| 6,535,200 B2 | 3/2003 | Philipp |
| 6,570,557 B1 | 5/2003 | Westerman et al. |
| 6,574,095 B2 | 6/2003 | Suzuki |
| 6,577,140 B1 | 6/2003 | Wenman |
| 6,583,632 B2 | 6/2003 | Von Basse et al. |
| 6,587,093 B1 | 7/2003 | Shaw et al. |
| 6,597,347 B1 | 7/2003 | Yasutake |
| 6,610,936 B2 | 8/2003 | Gillespie et al. |
| 6,614,313 B2 | 9/2003 | Crofts et al. |
| 6,624,640 B2 | 9/2003 | Lund et al. |
| 6,639,586 B2 | 10/2003 | Gerpheide |
| 6,649,924 B1 | 11/2003 | Philipp et al. |
| 6,667,740 B2 | 12/2003 | Ely et al. |
| 6,673,308 B2 | 1/2004 | Hino et al. |
| 6,677,932 B1 | 1/2004 | Westerman |
| 6,680,731 B2 | 1/2004 | Gerpheide et al. |
| 6,683,462 B2 | 1/2004 | Shimizu |
| 6,690,066 B1 | 2/2004 | Lin et al. |
| 6,705,511 B1 | 3/2004 | Dames et al. |
| 6,714,817 B2 | 3/2004 | Daynes et al. |
| 6,720,777 B2 | 4/2004 | Wang |
| 6,723,937 B2 | 4/2004 | Englemann et al. |
| 6,730,863 B1 | 5/2004 | Gerpheide et al. |
| 6,731,121 B1 | 5/2004 | Hsu et al. |
| 6,744,258 B2 | 6/2004 | Ishio et al. |
| 6,750,852 B2 | 6/2004 | Gillespie et al. |
| 6,781,577 B2 | 8/2004 | Shigetaka |
| 6,788,221 B1 | 9/2004 | Ely et al. |
| 6,796,216 B2 | 9/2004 | Kuchheuser |
| 6,806,693 B1 | 10/2004 | Bron |
| 6,809,275 B1 | 10/2004 | Cheng et al. |
| 6,810,442 B1 | 10/2004 | Lin et al. |
| 6,825,673 B1 | 11/2004 | Yamaoka |
| 6,838,887 B2 | 1/2005 | Denen et al. |
| 6,839,052 B1 | 1/2005 | Kramer |
| 6,856,433 B2 | 2/2005 | Hatano et al. |
| 6,861,961 B2 | 3/2005 | Sandbach et al. |
| 6,873,203 B1 | 3/2005 | Latham, II et al. |
| 6,879,215 B1 | 4/2005 | Roach |
| 6,882,338 B2 | 4/2005 | Flowers |
| 6,888,536 B2 | 5/2005 | Westerman et al. |
| 6,888,538 B2 | 5/2005 | Ely et al. |
| 6,891,531 B2 | 5/2005 | Lin |
| 6,893,724 B2 | 5/2005 | Lin et al. |
| 6,914,547 B1 | 7/2005 | Swaroop et al. |
| 6,933,873 B1 | 8/2005 | Horsley et al. |
| 6,940,291 B1 | 9/2005 | Ozick |
| 6,946,853 B2 | 9/2005 | Gifford et al. |
| 6,949,937 B2 | 9/2005 | Knoedgen |
| 6,958,594 B2 | 10/2005 | Redl et al. |
| 6,969,978 B2 | 11/2005 | Dening |
| 6,970,126 B1 | 11/2005 | O'Dowd et al. |
| 6,975,123 B1 | 12/2005 | Malang et al. |
| 6,993,607 B2 | 1/2006 | Philipp |
| 6,999,009 B2 | 2/2006 | Monney |
| 7,006,078 B2 | 2/2006 | Kim |
| 7,032,051 B2 | 4/2006 | Reay et al. |
| 7,046,230 B2 | 5/2006 | Zadesky et al. |
| 7,068,039 B2 | 6/2006 | Parker |
| 7,075,316 B2 | 7/2006 | Umeda et al. |
| 7,078,916 B2 | 7/2006 | Denison |
| 7,098,675 B2 | 8/2006 | Inaba et al. |
| 7,109,978 B2 | 9/2006 | Gillespie et al. |
| 7,119,550 B2 | 10/2006 | Kitano et al. |
| 7,151,276 B2 | 12/2006 | Gerlach et al. |
| 7,158,056 B2 | 1/2007 | Wright et al. |
| 7,158,125 B2 | 1/2007 | Sinclair et al. |
| 7,205,777 B2 | 4/2007 | Schulz et al. |
| 7,245,131 B2 | 7/2007 | Kurachi et al. |
| 7,253,643 B1 | 8/2007 | Seguine |
| 7,271,608 B1 | 9/2007 | Vermeire et al. |
| 7,307,485 B1 | 12/2007 | Snyder et al. |
| 7,333,090 B2 | 2/2008 | Tanaka et al. |
| 7,359,816 B2 | 4/2008 | Kumar et al. |
| 7,375,535 B1 | 5/2008 | Kutz et al. |
| 7,378,810 B1 * | 5/2008 | Sutardja et al. ............... 318/268 |
| 7,381,031 B2 | 6/2008 | Kawaguchi et al. |
| 7,392,431 B2 | 6/2008 | Swoboda |
| 7,439,962 B2 | 10/2008 | Reynolds et al. |
| 7,466,307 B2 | 12/2008 | Trent, Jr. et al. |
| 7,479,788 B2 | 1/2009 | Bolender et al. |
| 7,495,659 B2 | 2/2009 | Marriott et al. |
| 7,499,040 B2 | 3/2009 | Zadesky et al. |
| 7,504,833 B1 | 3/2009 | Seguine |
| 7,598,752 B2 | 10/2009 | Li |
| 7,598,822 B2 | 10/2009 | Rajagopal et al. |
| 7,663,607 B2 | 2/2010 | Hotelling et al. |
| 7,667,468 B1 | 2/2010 | Anderson |
| 7,812,827 B2 | 10/2010 | Hotelling et al. |
| 7,831,070 B1 | 11/2010 | Cheng et al. |
| 8,040,142 B1 | 10/2011 | Bokma et al. |
| 8,068,097 B2 | 11/2011 | Guanghai |
| 8,082,566 B2 | 12/2011 | Stallings |
| 8,093,914 B2 | 1/2012 | Maharyta et al. |
| 8,144,125 B2 | 3/2012 | Peng et al. |
| 8,144,126 B2 | 3/2012 | Wright |
| 8,169,238 B1 | 5/2012 | Maharyta et al. |
| 8,248,084 B2 * | 8/2012 | Bokma et al. ............... 324/658 |
| 8,358,142 B2 | 1/2013 | Maharyta |
| 2001/0048313 A1 * | 12/2001 | Frank ............... 324/663 |
| 2002/0000978 A1 | 1/2002 | Gerpheide |
| 2002/0063688 A1 | 5/2002 | Shaw et al. |
| 2002/0080014 A1 | 6/2002 | Mccarthy et al. |
| 2002/0191029 A1 | 12/2002 | Gillespie et al. |
| 2003/0062889 A1 | 4/2003 | Ely et al. |
| 2003/0063428 A1 | 4/2003 | Nishi |
| 2003/0080755 A1 | 5/2003 | Kobayashi |
| 2003/0091220 A1 | 5/2003 | Sato et al. |
| 2003/0112021 A1 | 6/2003 | Palata et al. |
| 2003/0156098 A1 | 8/2003 | Shaw et al. |
| 2003/0160808 A1 | 8/2003 | Foote et al. |
| 2003/0183864 A1 | 10/2003 | Miyazawa |
| 2003/0183884 A1 | 10/2003 | Miyazawa |
| 2003/0184315 A1 | 10/2003 | Eberlein |
| 2004/0041798 A1 | 3/2004 | Kim |
| 2004/0056845 A1 | 3/2004 | Harkcom et al. |
| 2004/0068409 A1 | 4/2004 | Tanaka et al. |
| 2004/0169594 A1 | 9/2004 | Ely et al. |
| 2004/0178989 A1 | 9/2004 | Shahoian et al. |
| 2004/0178997 A1 | 9/2004 | Gillespie et al. |
| 2004/0217945 A1 | 11/2004 | Miyamoto et al. |
| 2004/0239616 A1 | 12/2004 | Collins |
| 2004/0239650 A1 | 12/2004 | Mackey |
| 2004/0252109 A1 | 12/2004 | Trent et al. |
| 2004/0263864 A1 | 12/2004 | Lukacs et al. |
| 2005/0021269 A1 | 1/2005 | Ely et al. |
| 2005/0024341 A1 | 2/2005 | Gillespie et al. |
| 2005/0031175 A1 | 2/2005 | Hara et al. |
| 2005/0062732 A1 | 3/2005 | Sinclair et al. |
| 2005/0073302 A1 | 4/2005 | Hibbs et al. |
| 2005/0073322 A1 | 4/2005 | Hibbs et al. |
| 2005/0083110 A1 | 4/2005 | Latham et al. |
| 2005/0099188 A1 | 5/2005 | Baxter |
| 2005/0159126 A1 | 7/2005 | Wang |
| 2005/0169768 A1 | 8/2005 | Kawaguchi et al. |
| 2005/0270273 A1 | 12/2005 | Marten |
| 2005/0275382 A1 | 12/2005 | Stessman et al. |
| 2005/0280639 A1 | 12/2005 | Taylor et al. |
| 2006/0022660 A1 | 2/2006 | Itoh |
| 2006/0026535 A1 | 2/2006 | Hotelling et al. |
| 2006/0032680 A1 | 2/2006 | Elias et al. |

(56) References Cited

U.S. PATENT DOCUMENTS

| | | |
|---|---|---|
| 2006/0033508 A1 | 2/2006 | Lee |
| 2006/0033724 A1 | 2/2006 | Chaudhri et al. |
| 2006/0038793 A1 | 2/2006 | Philipp |
| 2006/0049834 A1 | 3/2006 | Umeda |
| 2006/0053387 A1 | 3/2006 | Ording |
| 2006/0066585 A1 | 3/2006 | Lin |
| 2006/0097991 A1 | 5/2006 | Hotelling et al. |
| 2006/0097992 A1 | 5/2006 | Gitzinger et al. |
| 2006/0108349 A1 | 5/2006 | Finley et al. |
| 2006/0113974 A1 | 6/2006 | Kan et al. |
| 2006/0114247 A1 | 6/2006 | Brown |
| 2006/0139469 A1 | 6/2006 | Yokota et al. |
| 2006/0152739 A1 | 7/2006 | Silvestre |
| 2006/0164142 A1 | 7/2006 | Stanley |
| 2006/0172767 A1 | 8/2006 | Cathey et al. |
| 2006/0176718 A1 | 8/2006 | Itoh |
| 2006/0187214 A1 | 8/2006 | Gillespie et al. |
| 2006/0193156 A1 | 8/2006 | Kaishita et al. |
| 2006/0197750 A1 | 9/2006 | Kerr et al. |
| 2006/0197752 A1 | 9/2006 | Hurst et al. |
| 2006/0227117 A1 | 10/2006 | Proctor |
| 2006/0232559 A1 | 10/2006 | Chien et al. |
| 2006/0258390 A1 | 11/2006 | Cui et al. |
| 2006/0262101 A1 | 11/2006 | Layton et al. |
| 2006/0267953 A1 | 11/2006 | Peterson et al. |
| 2006/0273804 A1 | 12/2006 | Delorme et al. |
| 2006/0290678 A1 | 12/2006 | Lii |
| 2007/0046299 A1 | 3/2007 | Hargreaves et al. |
| 2007/0069274 A1 | 3/2007 | Elsass et al. |
| 2007/0074913 A1 | 4/2007 | Geaghan et al. |
| 2007/0076897 A1 | 4/2007 | Philipp |
| 2007/0132737 A1 | 6/2007 | Mulligan et al. |
| 2007/0152983 A1 | 7/2007 | Mckillop et al. |
| 2007/0164756 A1 | 7/2007 | Lee |
| 2007/0176609 A1 | 8/2007 | Ely et al. |
| 2007/0176903 A1 | 8/2007 | Dahlin et al. |
| 2007/0228256 A1 | 10/2007 | Mentzer et al. |
| 2007/0229469 A1 | 10/2007 | Seguine |
| 2007/0236478 A1 | 10/2007 | Geaghan et al. |
| 2007/0263191 A1 | 11/2007 | Shibazaki |
| 2007/0268243 A1 | 11/2007 | Choo et al. |
| 2007/0268265 A1 | 11/2007 | Xiaoping |
| 2007/0273659 A1 | 11/2007 | Xiaoping et al. |
| 2007/0291013 A1 | 12/2007 | Won |
| 2007/0296709 A1 | 12/2007 | Guanghai |
| 2008/0007529 A1 | 1/2008 | Paun et al. |
| 2008/0007534 A1 | 1/2008 | Peng et al. |
| 2008/0024455 A1 | 1/2008 | Lee et al. |
| 2008/0036473 A1 | 2/2008 | Jansson |
| 2008/0047764 A1 | 2/2008 | Lee |
| 2008/0062140 A1 | 3/2008 | Hotelling et al. |
| 2008/0088595 A1 | 4/2008 | Liu et al. |
| 2008/0111714 A1 | 5/2008 | Kremin |
| 2008/0158178 A1 | 7/2008 | Hotelling et al. |
| 2008/0179112 A1 | 7/2008 | Qin et al. |
| 2008/0196945 A1 | 8/2008 | Konstas |
| 2008/0250864 A1 | 10/2008 | Shipton |
| 2008/0266263 A1 | 10/2008 | Motaparti et al. |
| 2009/0096758 A1 | 4/2009 | Hotelling et al. |
| 2009/0322351 A1 | 12/2009 | Mcleod |
| 2010/0013791 A1* | 1/2010 | Haga et al. .................. 345/174 |
| 2010/0328262 A1 | 12/2010 | Huang et al. |
| 2011/0025629 A1 | 2/2011 | Grivna et al. |
| 2011/0234523 A1 | 9/2011 | Chang et al. |
| 2012/0043973 A1 | 2/2012 | Kremin |
| 2013/0049771 A1 | 2/2013 | Peng et al. |

OTHER PUBLICATIONS

USPTO Notice of Allowance for U.S. Appl. No. 11/801,115 dated Feb. 2, 2012; 10 pages.
USPTO Notice of Allowance for U.S. Appl. No. 11/801,115 dated Nov. 30, 2011; 5 pages.
USPTO Notice of Allowance for U.S. Appl. No. 11/824,249 dated Mar. 14, 2013; 5 pages.
USPTO Notice of Allowance for U.S. Appl. No. 12/040,387 dated Jan. 28, 2013; 8 pages.
USPTO Notice of Allowance for U.S. Appl. No. 12/040,387 dated Mar. 1, 2013; 8 pages.
USPTO Notice of Allowance for U.S. Appl. No. 12/040,387 dated Nov. 8, 2012; 9 pages.
USPTO Notice of Allowance for U.S. Appl. No. 12/239,692 dated Jun. 25, 2012; 8 pages.
USPTO Notice of APowance for U.S. Appl. No. 12/239,692 dated Aug. 15, 2012; 8 pages.
USPTO Notice of Allowance for U.S. Appl. No. 12/239,692 dated Sep. 18, 2012; 8 pages.
USPTO Notice of Allowance for U.S. Appl. No. 12/367,279 dated Aug. 23, 2010; 7 pages.
USPTO Notice of Allowance for U.S. Appl. No. 12/380,141 dated Mar. 8, 2013; 5 papes.
USPTO Notice of Allowance for U.S. Appl. No. 12/380,141 dated Aug. 14, 2012; 8 pages.
USPTO Notice of Allowance for U.S. Appl. No. 12/380,141 dated Jul. 31, 2012: 5 pages.
USPTO Notice of Allowance for U.S. Appl. No. 12/380,141 dated Nov. 8, 2012; 7 pages.
USPTO Notice of Ailowance for U.S. Appl. No. 12/395,462 dated Aug. 29, 2012; 5 pages.
USPTO Notice of Allowance for U.S. Appl. No. 12/395,462 dated Oct. 2, 2012; 5 pages.
USPTO Notice of Ailowance for U.S. Appl. No. 12/395,462 dated Nov. 14, 2012; 5 pages.
USPTO Notice of Allowance for U.S. Appl. No. 12/608,147 dated Aug. 13, 2012: 7 pages.
USPTO Notice of Allowance for U.S. Appl. No. 12/606,147 dated Sep. 28, 2012; 6 pages.
USPTO Notice of Allowance for U.S. Appl. No. 13/047,035 dated Feb. 6, 2013; 9 pages.
USPTO Notice of Allowance for U.S. Appl. No. 13/047,035 dated Apr. 18, 2013: 9 pages.
USPTO Notice of Allowance for U.S. Appl. No. 13/047,035 dated Dec. 14, 2012; 12 pages.
USPTO Notice of Allowance for U.S. Appl. No. 13/047,620 dated Jun. 8, 2012: 5 pages.
USPTO Notice of Allowance for U.S. Appl. No. 13/047,620 dated Jun. 27, 2012: 2 pages.
USPTO Notice of Allowance for U.S. Appl. No. 13/301,764 dated Apr. 17, 2013: 10 pages.
USPTO Notice of Allowance for U.S. Appl. No. 13/301,764 dated Jun. 28, 2012; 8 pages.
USPTO Notice of Allowance for U.S. Appl. No. 13/301,764 dated Oct. 4, 2012; 10 pages.
USPTO Notice of Allowance for U.S. Appl. No. 13/612,803 date Dec. 10, 2012; 8 pages.
USPTO Notice of Allowance for U.S. Appl. No. 13/864,421 dated Feb. 21, 2013; 7 pages.
USPTO Notice of Allowance, U.S. Appl. No. 11/729,818, dated Jan. 26, 2011, 12 pages.
USPTO Notice of Allowance, U.S. Appl. No. 11/729,818, dated May 9, 2011, 8 pages.
USPTO Notice of Allowance, U.S. Appl. No. 11/729,818, dated Jun. 9, 2011, 13 pages.
USPTO Notice of Allowance, U.S. Appl. No. 11/729,818, dated Oct. 5, 2010, 33 pages.
USPTO Notice of Allowance, U.S. Appl. No. 11/729,818, dated Jun. 25, 2010, 7 pages.
USPTO Notice of Allowance, U.S. Appl. No. 13/047,620, dated Apr. 11, 2012, 19 pages.
USPTO Restriction Requirement, U.S. Appl. No. 13/047,620, dated Feb. 27, 2012, 7 pages.
Van Ess, David; "Simulating a 555 Timer with PSoC," Cypress Semiconductor Corporation, Application Note AN2286, May 19, 2005; 10 pages.
Vladislav Golub, PhD., "Sigma-Delta ADCs", pub, date: Jun. 17, 2003, 10 pages.

(56) References Cited

OTHER PUBLICATIONS

Wikipedia, The Free Encyc:opedia, "IBM PC Keyboard," http://en.wikipedia org/wiki/PC_keyboard> accessed May 19, 2006; 3 pages.

Written Opinion of the International Searching Authority for International Application No. PCT/US08/60896 mailed Sep. 22, 2008; 4 pages.

"The Virtual Keyboard: I-Tech Bluetooth/Serial Virtual Laser Keyboard Available Now!" The Virtual Laser Keyboard (VKB) Online Worldwide Shop, <http://www,virtual-laser-keyboard.com>, downloaded Apr. 13, 2006; 4 pages.

U.S. Appl. No. 11/493,350: "Technique for Increasing he Sensitivity of Capacitive Sensor Arrays," Lee et al., filed Jul. 25, 2006: 48 pages.

U.S. Appl. No. 12/166,228 "Capacitance to Frequency Converter," Andriy Maharyta et al., filed Jul. 1, 2008; 29 pages.

U.S. Appl. No. 12/332,980: "Compensation Circuit for a TX-RX Capacitive Sensor," Andriy Maharyte, filed Dec. 11, 2008; 55 pages.

U.S. Appl. No. 13/047,035: "Apparatus and Method for Reducing Average Scan Rate to Detect a Conductive Object on a Sensing Device," Tao Peng, filed Mar. 14, 2011: 64 pages.

U.S. Appl. No. 13/047,270: "Touch Detection Techniques for Capacit1ve Touch Sense Systems," Louis W. Bokma. filed Mar. 14, 2011; 34 pages.

U.S. Appl. No. 13/612,803: "Capacitive Field Sensor with Sigma-Delta Modulator," Andriy Ryshtun, filed Sep. 12, 2012; 56 pages.

U.S. Appl. No. 13/670,671: "System and Method to Measure Capacitance of Capacitive Sensor Array," Nathan Y. Moyal, filed Nov. 7, 2012; 40 pages.

U.S. Appl. No. 13/671,389: "Touch Sensing," Jonathan R. Peterson, filed Nov. 7, 2012: 35 jpages.

U.S. Appl. No. 13/720,861: "Methods and Circuits for Measuring Mutual and Self Capacitance," Andriy Maharyta, filed Dec. 19, 2012; 38 pages.

U.S. Appl. No. 60/788,127: "Touch Detection for Capacitive Touch Sense Systems." Louis Bokma, filed Mar. 31, 2006; 17 pages.

U.S. Appl. No. 60/947,865: "Capacitive Field Senso with Sigma-Delt Modulator," Viktor Kremin, filed Jul. 3, 2007; 33 pages.

U.S. Appl. No. 60/947,871 "Capactance to Frquency Converter," Andrey Mahanta et al., filed Jul. 3, 2007; 21 pages.

U.S. Appl. No. 61/030,526 : "Capacitive Sensing Universal System and Method," Andriy Ryshtun, filed Feb. 21, 2008; 22 pages.

Chapweske, Adam; "The PS/2 Mouse Interface," PS/2 Mouse Interfacing, 2001, retrieved on May 18, 2006; 11 pages.

Cypress Semiconductor Corporation, "CY8C21x34 Data Sheet," CSR User Module, CSR V.1.0; Oct. 6, 2005; 36 pages.

Cypress Semiconductor Corporation, "Cypress Introduces PSoC(TM)-Based Capacitive Touch Sensor Solution," Cypress Press Release; May 31, 2005; <http://www.cypress.com/portal/server>; retrieved on Feb. 5, 2007; 4 pages.

Cypress Semiconductor Corporation, "FAN Controller CG6457AM and CG6462AM," PSoC Mixed Signal Array Preliminary Data Sheet; May 24, 2005; 25 pages.

Cypress Semiconductor Corporation, "PSoC CY8C20x34 Technical Reference Manual (TRM)," PSoC CY8C20x34 TRM, Version 1,0, 2006; 218 pages.

Cypress Semiconductor Corporation, "PSoC Mixed-Signal Controllers," Production Description: <http://www.cypress.com/portal/server>; retrieved on Sep. 27, 2005; 2 pages.

Cypress Semicondutor Corporation. "Release Notes sm017," Jan. 24, 2007; 3 pages.

Dennis Soguine, "Capacitive. Switch Scan," AN2233a, Application Note, CY8C21x34, Apr. 7, 2005; 6 pages.

Lee, Mark; "EMC Design Considerations for PSoC CapSense Applications," Cypress Semiconductor Corporation, Application Note AN2318: Sep. 16, 2005: 6 pages.

Mark Lee, "CapSense Best Practices," Cypress Semiconductor Application Note. Oct. 16, 2006: 10 pages.

U.S. Appl. No. 61/108,450, "Alternative Realizations of the CSX (TxRx-I) Sensing Scheme for ITO Panels," Andriy Maharyta, filed Oct. 24, 2008, 7 pages.

Ryan Seguine et al, "Layout Guidelines for PSoC CapSense", Cypress Application Note AN2292, Revision B, Oct. 31, 2005; all pages.

Sedra, Adel S. et al., "Microelectronic Circuits," 3rd Edition, Oxford University Press, pp. xiii-xx and 861-863, 1991; 20 pages.

SIPO 1st Office Action for Application No. 200880120802.9 dated Nov. 5, 2012; 6 pages.

The Authoritative Dictionary of IEEE Standards Terms, 2000, IEEE Press Pubiications, 7th Edition, pp. 1133-1134; 4 pages.

USPTO Advisory Action for U.S. Appl. No. 11/230,719 dated Nov. 30, 2007; 3 pages.

USPTO Advisory Action for U.S. Appl. No. 11/395,417 dated Jul. 6, 2007: 3 pages.

USPTO Advisory Action for U.S. Appl. No. 11/437,517 dated Apr. 7, 2010: 3 pages.

USPTO Advisory Action for U.S. Appl. No. 11/477,179 dated Jun. 7, 2010; 3 pages.

USPTO Advisory Action for U.S. Appl. No. 11/512,042 dated Feb. 23, 2011: 3 pages.

USPTO Advisory Action for U.S. Appl. No. 12/367,279 dated Jun. 25, 2010; 3 pages.

USPTO Advisory Action for U.S. Appl. No. 12/395,969 dated Sep. 21, 2012; 3 pages.

USPTO Final Rejection for U.S. Appl. No. 09/975,105 dated Jul. 13, 2006; 7 pages.

USPTO Final Rejection for U.S. Appl. No. 11/230,719 dated Sep. 7, 2007; 9 pages.

USPTO Final Rejection for U.S. Appl. No. 11/273,708 dated Jul. 5, 2007; 8 pages.

USPTO Final Rejection for U.S. Appl. No. 11/395,417 dated Apr. 24, 2007; 9 pages.

USPTO Final Rejection for U.S. Appl. No. 11/437,517 dated Jan. 26, 2010; 11 pages.

USPTO Final Rejection for U.S. Appl. No. 11/477,179 dated Apr. 1, 2010; 10 pages.

USPTO Final Rejection for U.S. Appl. No. 11/477,179 dated Nov. 24, 2010; 10 pages.

USPTO Final Rejection for U.S. Appl. No. 11/484,085 dated Mar. 16, 2010; 7 pages.

USPTO Final Rejection for U.S. Appl. No. 11/502,267 dated Feb. 3, 2009; 10 pages.

USPTO Final Rejection for U.S. Appl. No. 11/512,042 dated Dec. 21, 2010; 7 pages.

USPTO Final Rejection for U.S. Appl. No. 11/800,896 dated Sep. 20, 2010: 19 pages.

USPTO Final Rejection for U.S. Appl. No. 12/166,228 dated Jan. 4, 2011; 9 pages.

USPTO Final Rejection for U.S. Appl. No. 12/367,279 dated Apr. 1, 2010; 6 pages.

USPTO Final Rejection for U.S. Appl. No. 12/395,969 dated Jul. 17, 2012 25 pages.

USPTO Final Rejection, U.S. Appl. No. 11/729,818, dated Jul. 2, 2009, 14 pages.

USPTO Non-Final Rejection for U.S. Appl. No. 09/975,105 dated Jan. 19, 2006: 5 pages.

USPTO Non-Final Rejection for U.S. Appl. No. 09/975,105 dated Apr. 19, 2005; 9 pages.

USPTO Non-Final Rejection for U.S. Appl. No. 11/230,719 dated Jan. 16, 2007; 8 pages.

USPTO Non-Final Rejection for U.S. Appl. No. 11/230,719 dated May 11, 2006, 5 pages.

USPTO Non-Final Rejection for U.S. Appl. No. 11/230,719 dated May 25, 2007; 6 pages.

USPTO Non-Finat Rejection for U.S. Appl. No. 11/230,719 dated Aug. 28, 2006, 7 pages.

USPTO Non-Final Rejection for U.S. Appl. No. 11/273,708 dated Mar. 19, 2007; 16 pages.

USPTO Non-Final Rejection for U.S. Appl. No. 11/395,417 dated Apr. 25, 2008; 7 pages.

(56) References Cited

OTHER PUBLICATIONS

USPTO Non-Final Rejection for U.S. Appl. No. 11/395,417 dated Oct. 26, 2006; 13 pages.
USPTO Non-Final Rejection for U.S. Appl. No. 11/395,417 dated Nov. 1, 2007; 8 pages.
USPTO Non-Final Rejection for U.S. Appl. No. 11/437,517 dated Aug. 3, 2010, 10 pages.
USPTO Non-Final Rejection for U.S. Appl. No. 11/437,517 dated Aug. 5, 2009; 9 pages.
USPTO Non-Final Rejection for U.S. Appl. No. 11/442,212 dated Feb. 25, 2011; 13 pages.
USPTO Non-Final Rejection for U.S. Appl. No. 11/477,179 dated Jun. 9, 2009; 13 pages.
USPTO Non-Final Rejection for U.S. Appl. No. 11/477,179 dated Jul. 20, 2010 ; 10 pages.
USPTO Non-Final Rejection for U.S. Appl. No. 11/477;179 dated Nov. 18, 2009; 10 pages.
USPTO Non-Final Rejection for U.S. Appl. No. 11/484,085 dated Sep. 17, 2009: 8 pages.
USPTO Non-Final Rejection for U.S. Appl. No. 11/493,350 dated Jun. 16, 2010, 8 pages.
USPTO Non-Final Rejection for U.S. Appl. No. 11/493,350 dated Nov. 9, 2010; 9 pages.
USPTO Non-Final Rejection for U.S. Appl. No. 11/502,267 dated Aug. 11, 2008; 10 pages.
USPTO Non-Final Rejection for U.S. Appl. No. 11/600,896 dated May 14, 2010; 15 pages.
USPTO Non-Final Rejection for U.S. Appl. No. 11/600,896 dated Dec. 16, 2009; 13 pages.
USPTO Non-Finat Rejection for U.S. Appl. No. 11/700,314 dated Mar. 26, 2010; 7 pages.
USPTO Non-Finai Rejection for U.S. Appl. No. 11/729,818 dated Dec. 17, 2008: 12 pages.
USPTO Non-Final Rejection for U.S. Appl. No. 11/824,249 dated Sep. 26, 2012; 11 pages.
USPTO Non-Final Rejection for U.S. Appl. No. 11/967,243 dated Sep. 17, 2009; 9 pages.
USPTO Non-Final Rejection for U.S. Appl. No. 12/166,228 dated Aug. 11, 2010; 6 pages.
USPTO Non-Final Rejection for U.S. Appl. No. 12/166,228 dated Dec. 30, 2009; 11 pages.
USPTO Non-Final Rejection for U.S. Appl. No. 12/367,279 dated Oct. 29, 2009; 8 pages.
USPTO Non-Final Rejection for U.S. Appl. No. 12/380,141 dated Jan. 29, 2013; 6 pages.
USPTO Non-Final Rejection for U.S. Appl. No. 12/380,141 dated Sep. 5, 2012; 6 pages.
USPTO Non-Final Rejection for U.S. Appl. No. 12/395,969 dated Feb. 8, 2013; 24 pages.
USPTO Non-Final Rejection for U.S. Appl. No. 13/049,556 dated Jan. 25, 2013; 11 pages.
USPTO Non-Finai Rejection for U.S. Appl. No. 13/612,803 dated Feb. 5, 2013; 7 pages.
USPTO Non-Finai Rejection for U.S. Appl. No. 13/720/861 dated Mar. 11, 2013; 9 pages.
USPTO Non-Final Rejection, U.S. Appl. No. 11/512,042, dated Jul. 13, 2010, 14 pages.
USPTO Notice of Allowance for 09/975,105 dated Dec. 4, 2006; 4 pages.
USPTO Notice of Allowance for U.S. Appl. No. 09/986,338 dated Feb. 16, 2010; 4 pages.
USPTO Notice of Allowance for U.S. Appl. No. 10/888,668 dated Aug. 2, 2006: 11 pages.
USPTO Notice of Allowance for U.S. Appl. No. 11/230,719 dated Jan. 16, 2008, 4 pages.
USPTO Notice of Allowance for U.S. Appl. No. 11/273,708 dated Aug. 9, 2007, 4 pages.
USPTO Notice of Allowance for U.S. Appl. No. 11/395,417 dated Nov. 6, 2008, 7 pages.
USPTO Notice of Allowance for U.S. Appl. No. 11/484,085 dated Jun. 10, 2010; 4 pages.
USPTO Notice of Allowance for U.S. Appl. No. 11/489,944 dated Apr. 9, 2007; 7 pages.
USPTO Notice of Allowance for U.S. Appl. No. 11/600,255 dated Feb. 5, 2013; 7 pages.
USPTO Notice of Allowance for U.S. Appl. No. 11/600,255 dated Mar. 11, 2013; 7 pages.
USPTO Notice of Allowance for U.S. Appl. No. 11/700,314 dated Sep. 15, 2010; 8 pages.
USPTO Notice of Allowance for U.S. Appl. No. 11/709,886 dated Feb. 18, 2010; 7 pages.
USPTO Notice of Allowance for U.S. Appl. No. 11/729,818 dated Feb. 24, 2010; 6 pages.
USPTO Final Rejection for U.S. Appl. No. 11/512,042 dated Apr. 10, 2014; 9 pages.
USPTO Non-Final Rejection for U.S. Appl. No. 11/512,042 dated Dec. 2, 2013; 7 pages.

* cited by examiner

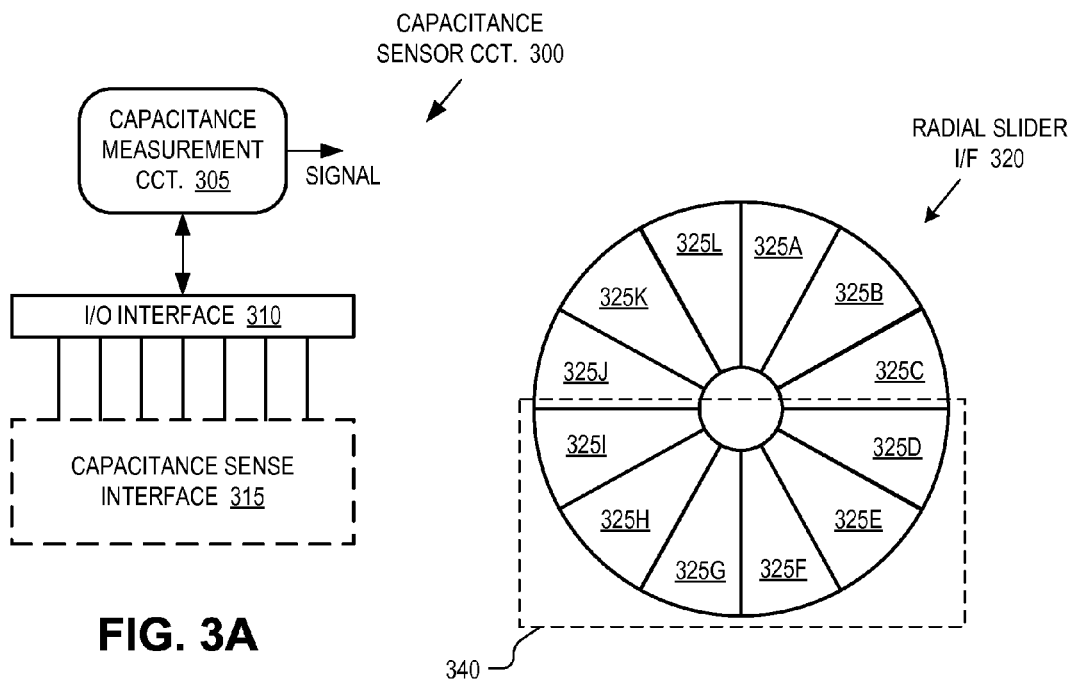
FIG. 3A
FIG. 3B
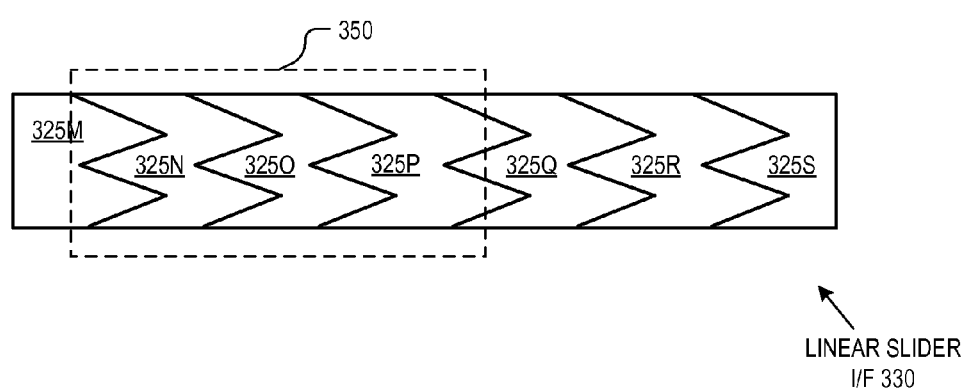
FIG. 3C

TOUCH DETECTION TECHNIQUES FOR CAPACITIVE TOUCH SENSE SYSTEMS

RELATED APPLICATIONS

This application is a continuation of U.S. application Ser. No. 13/047,620 filed Mar. 14, 2011, now U.S. Pat. No. 8,248,084 which is a continuation of Ser. No. 13/047,270 filed Mar. 14, 2011, which is a continuation of Ser. No. 11/729,818 filed Mar. 28, 2007, now U.S. Pat. No. 8,040,142, issued Oct. 18, 2011, which claims priority to U.S. Provisional Patent Application No. 60/788,127, filed Mar. 31, 2006, all of which are hereby incorporated by reference in their entirety.

TECHNICAL FIELD

This disclosure relates generally to capacitance sensing techniques, and in particular but not exclusively, relates to improved touch detection techniques for capacitance sense interfaces.

BACKGROUND INFORMATION

Capacitance sensors are used to implement a variety of useful functions including touch sensors (e.g., touch pad, touch dial, touch wheel, etc.), determining the presence of an object, accelerometers, and other functions. FIG. 1A illustrates a conventional capacitance measurement circuit 100 including a relaxation oscillator, a reference clock, and a frequency comparator. The relaxation oscillator is coupled to drive a charging current ($I_C$) in a single direction onto a device under test ("DUT") capacitor. As the charging current accumulates charge on the DUT capacitor, the voltage across the capacitor increases with time as a function of $I_C$ and its capacitance C. Equation 1 describes the relation between current, capacitance, voltage and time for a charging capacitor.

$$CdV = I_C dt \quad \text{(Equation 1)}$$

The relaxation oscillator begins by charging the DUT capacitor from a ground potential or zero voltage and continues to accumulate charge on the DUT capacitor at a fixed charging current $I_C$ until the voltage across the DUT capacitor reaches a reference voltage (Vref). At Vref, the relaxation oscillator allows the accumulated charge to discharge or the DUT capacitor to "relax" back to the ground potential and then the process repeats itself. The relaxation oscillator outputs a relaxation oscillator clock signal (RO CLK) having a frequency ($f_{RO}$) dependent upon capacitance C of the DUT capacitor, charging current $I_C$, a discharge time $t_d$, and Vref, as described in equation 2 below.

$$f_{RO} = \left( C \cdot \frac{Vref}{I_C} + t_d \right)^{-1} \quad \text{(Equation 2)}$$

If capacitance C of the DUT capacitor changes, then $f_{RO}$ will change proportionally according to equation 2. By comparing $f_{RO}$ of RO CLK against the frequency ($f_{REF}$) of a known reference clock signal (REF CLK), the change in capacitance ΔC can be measured. Accordingly, equations 3 and 4 below describe that a change in frequency between RO CLK and REF CLK is proportional to a change in capacitance of the DUT capacitor.

$$\Delta C \propto \Delta f, \text{ where} \quad \text{(Equation 3)}$$

$$\Delta f = f_{RO} - f_{REF}. \quad \text{(Equation 4)}$$

The frequency comparator is coupled to receive RO CLK and REF CLK, compare their frequencies $f_{RO}$ and $f_{REF}$, respectively, and output a signal indicative of the difference Δf between these frequencies. By monitoring Δf one can determine whether the capacitance of the DUT capacitor has changed.

FIG. 1B illustrates another capacitance sensing technique using a charge transfer mechanism. FIG. 1B illustrates a conventional capacitance measurement circuit 101 including three switches 105 with control terminals φ0, φ1, and φ2, and summing capacitor 110 having a capacitance $C_{SUM}$, and an analog to digital ("ADC") converter 115. Capacitance measurement circuit 101 may be used to sense changes in a DUT capacitor 120 having a changing capacitance $C_{DUT}$.

During operation, capacitance measurement circuit 101 operates as follows to sense capacitance changes on DUT capacitor 120. First, summing capacitor 110 is discharged to a ground potential by asserting control terminal φ0 to open circuit switch SW0 and by asserting control terminal φ1 to close circuit switch SW1. Once discharged to ground, integrating capacitor 110 is disconnected from ground by asserting φ1 to open switch SW1. Then, DUT capacitor 120 is charged to the supply voltage VS by asserting φ0 to open circuit switch SW0 and asserting φ2 to close circuit switch SW2. Once DUT capacitor 120 charges to the supply voltage VS, the charge on DUT capacitor 120 is transferred onto summing capacitor 110 and distributed between the two capacitors. Charge transfer occurs by asserting φ1 and φ2 to open circuit switches SW1 and SW2, respectively, and asserting φ0 to close circuit switch SW0.

The above stages of charging DUT capacitor 120 and transferring the charge onto summing capacitor 110 are repeated a fixed number times causing the voltages of nodes N1 and N2 to ramp with time as illustrated in line graphs 130 and 135, respectively. After a fixed number of consecutive charging stages and charge transferring stages, ADC converter 115 samples the final voltage on node N2. The capacitance $C_{DUT}$ is determined based on the output of ADC converter 115 and is proportional to the voltage at node N2 after the final charge transfer stage.

Because the capacitance deviation of a capacitance sense switch due to a finger press is small compared to the underlying capacitance of the switch itself, the above two capacitance sensing techniques can be susceptible to external noise, interference, or other environmental factors. For example, parasitic capacitances may couple to the user interface, electromagnetic interference ("EMI") may disrupt capacitance measurements and control signals, deviations in operating temperature can cause thermal expansions and dielectric variations that affect capacitance measurements, user error can result in malfunctions, and so forth. These environmental factors can often result in disruptive capacitance deviations that are larger than the capacitance changes induced by a finger interaction with the capacitance sense interface. Accordingly, a reliable capacitance sense interface and control system should account for some or all of these sources of noise.

BRIEF DESCRIPTION OF THE DRAWINGS

Non-limiting and non-exhaustive embodiments of the invention are described with reference to the following figures, wherein like reference numerals refer to like parts throughout the various views unless otherwise specified.

FIG. 3A is a functional block diagram illustrating a capacitance sensor circuit, in accordance with an embodiment of the invention.

FIG. 3B is a block diagram illustrating a radial slider interface, in accordance with an embodiment of the invention.

FIG. 3C is a block diagram illustrating a linear slider interface, in accordance with an embodiment of the invention.

DETAILED DESCRIPTION

Embodiments of a system and method for improved capacitive touch sense detection are described herein. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Figure 1A:
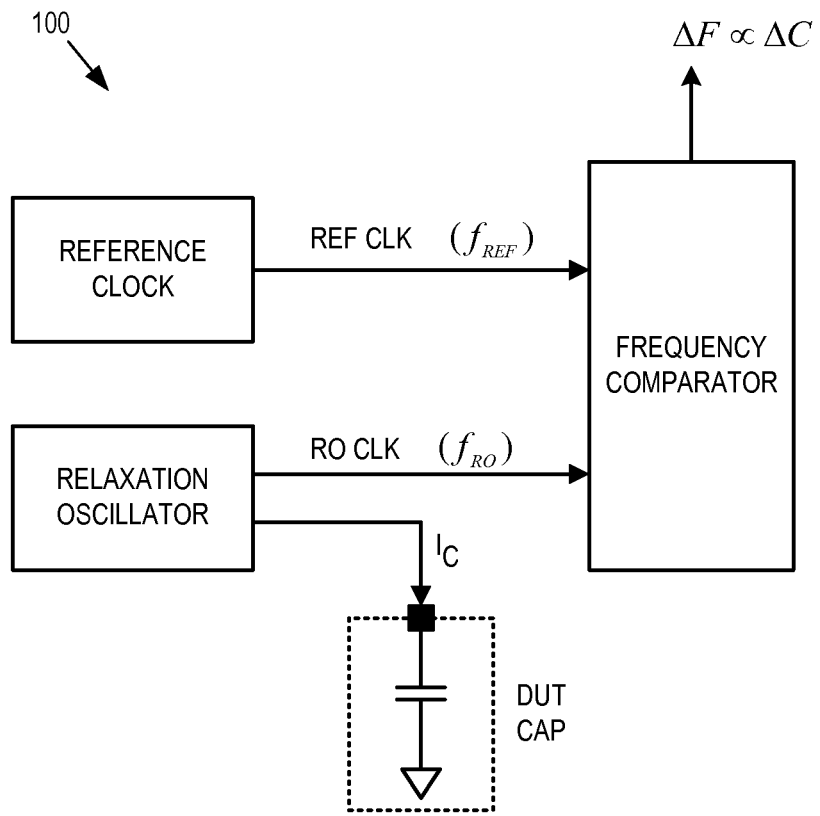
FIG. 1A is a block diagram illustrating a conventional capacitance sensor.
Figure 1B:
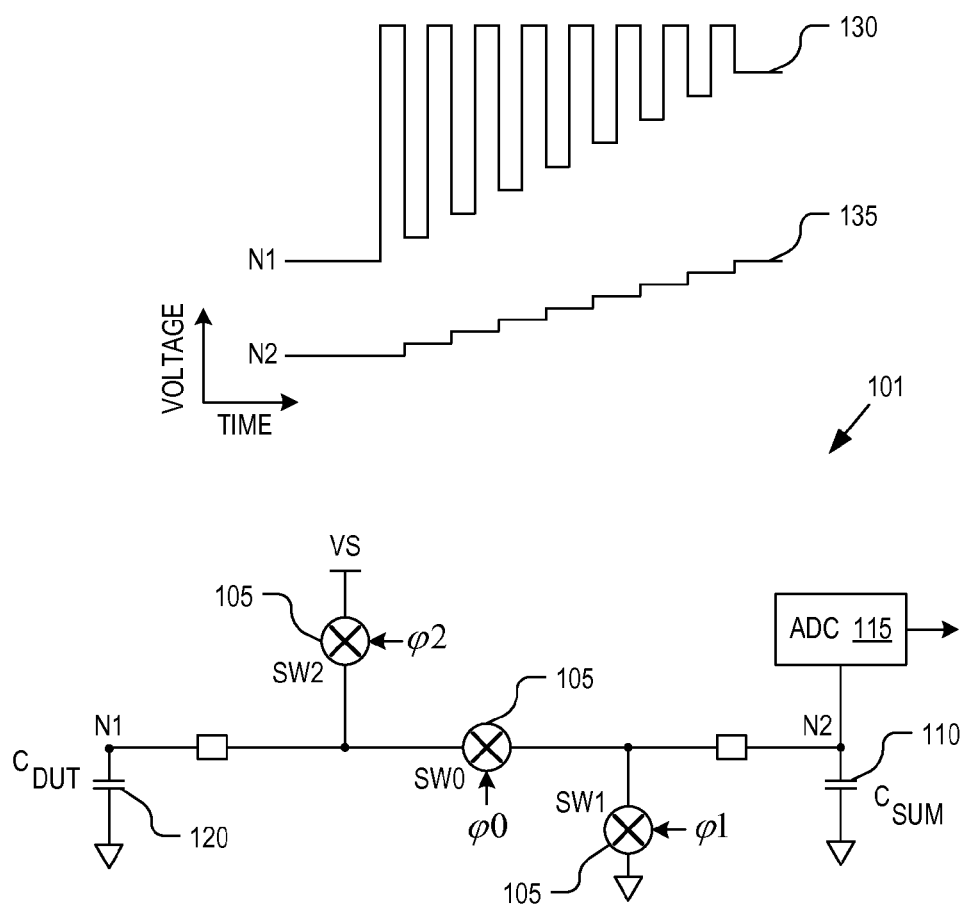
FIG. 1B is a block diagram illustrating a conventional capacitance sensor.
Figure 2:
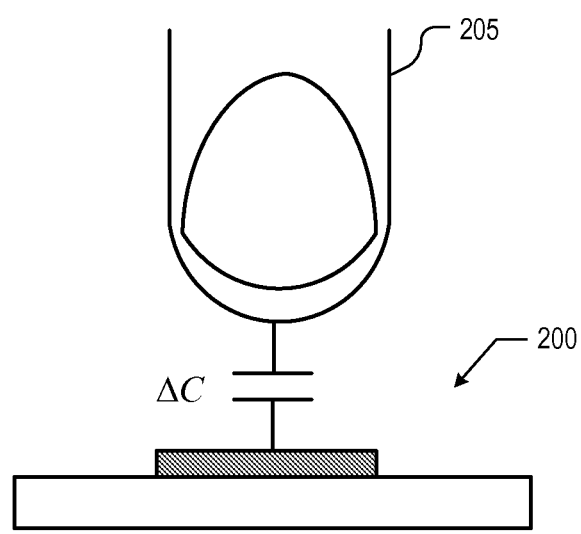
FIG. 2 illustrates a user finger interacting with a capacitance sensor, in accordance with an embodiment of the invention.

FIG. 2 illustrates a user finger 205 interacting with a capacitance sensor 200, in accordance with an embodiment of the invention. In short, when a conductive object, such as user finger 205, is moved into proximity with capacitance sensor 200, its capacitance is increased above its baseline capacitance, resulting in a measurable capacitance change. By monitoring capacitance sensor 200 for deviations $\Delta C$ from its baseline capacitance, sensor activations can be determined and registered within software. Of course, a user interaction with capacitance sensor 200 is not limited to a finger. Other conductive objects may be used to interact with capacitance sensor 200 including, a stylus, a pen, or any other conductive object.

By grouping a plurality of capacitance sensors 200 into an array of capacitance sensors, such as a radial slider array, a linear slider array, a touch pad array, or the like, a variety of capacitance sense interfaces may be implemented. For example, capacitance sensor arrays may be used to implement user interfaces of a variety of products including: door switches, white goods (e.g., kitchen appliances), laptop computers, desktop computers, personal digital assistants ("PDAs"), portable music players (e.g., MP3 players), wireless telephones, cellular telephones, radios, or the like. Capacitance sensor arrays may also be used to implement position sensors.

FIG. 3A is a functional block diagram illustrating a capacitance sensor circuit 300, in accordance with an embodiment of the invention. The illustrated embodiment of capacitance sensor circuit 300 includes capacitance measurement circuitry 305, an input/output ("I/O") interface 310, and a capacitance sense interface 315. I/O interface 310 links capacitance sense interface 315 to capacitance measurement circuit 305. In one embodiment, I/O interface 310 is a configurable analog interconnect between capacitance measurement circuitry 305 and capacitance sense interface 315. For example, I/O interface 310 may be configured to sequentially scan multiple capacitance ("CAP") sensors within capacitance sense interface 315 to time-share capacitance measurement circuitry 305. Once connected to an individual CAP sensor within capacitance sense interface 315, capacitance measurement circuitry 305 can measure its capacitance to determine whether its capacitance has deviated sufficiently from its baseline capacitance such that the activation event should be registered in software as a user activation (i.e., acknowledged in software such that an appropriate action or function is executed).

Capacitance measurement circuitry 305 may be implemented using a variety of different capacitance measurement circuits, such as capacitance measurement circuit 100, capacitance measurement circuit 101, or otherwise. During operation, capacitance measurement circuitry 305 may output a signal or value that is representative of the capacitance of a selected CAP sensor. In one embodiment, this value may include a count of a number of clock cycles from a gated reference clock that transpired during a single charge and discharge cycle of the selected CAP sensor. This value or count may subsequently be analyzed by software to determine whether the measured capacitance deviation should be registered (i.e., acknowledged) by software as a valid user activation event.

FIGS. 3B and 3C illustrate examples of capacitance sense interface 315, in accordance with an embodiment of the invention. FIG. 3B illustrates a radial slider interface 320 having twelve individual CAP sensors 325. FIG. 3C illustrates a linear slider interface 330 having seven CAP sensors 325. It should be appreciated that radial slider interface 320 and linear slider interface 330 may include more or less CAP sensors than illustrated. Furthermore, radial slider interface 320 and linear slider interface 330 are only intended as example embodiments of capacitance sense interface 315. Other configurations or arrays of CAP sensors may be implemented.

Figure 4:
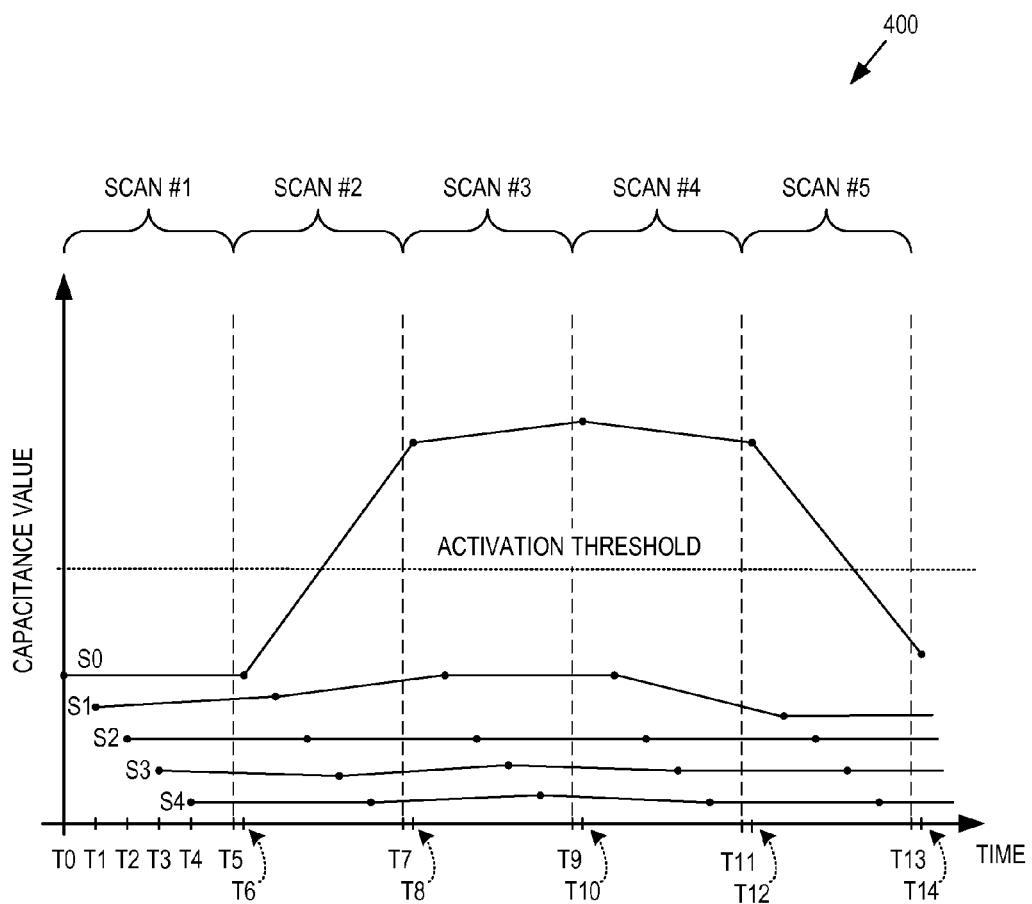
FIG. 4 is a chart illustrating a scanning technique of use with a multi-sensor capacitance sense interface, in accordance with an embodiment of the invention.

FIG. 4 is a chart 400 illustrating a scanning technique for use with capacitance sensor circuit 300 to monitor capacitance sense interface 315 for user activations, in accordance with an embodiment of the invention. Chart 400 plots capacitance values for CAP sensors 325 versus time. The capacitance values plotted along the y-axis of chart 400 are values determined by capacitance measurement circuitry 305 that are representative of a measured capacitance of CAP sensors 325. In one embodiment, the capacitance values are clock cycle counts gated by relaxation oscillator circuitry included within capacitance measurement circuitry 305. In one embodiment, the capacitance values are the output of an analog-to-digital ("ADC") converter (e.g., ADC 115).

Each trace S0, S1, S2, S3, S4 represents a measured capacitance value associated with a corresponding one of CAP sensors 325 (only five traces are illustrated so as not to clutter the drawing). Each CAP sensor 325 is sampled in sequence by capacitance measurement circuitry 305 one time during each scan cycle (e.g., scan cycles 1, 2, 3, 4, and 5 are illustrated). For example, CAP sensor 325A (represented by trace S0) is sampled at times T0, T6, T8, T10, T12 . . . , CAP sensor 325B (represented by trace S1) is sampled at time T1, CAP sensor 325C (represented by trace S2) is sampled at time T2, and so on. Traces S0 to S4 have been staggered vertically for clarity; however, if CAP sensors 325 are physically identical in size and orientation, traces S0 to S4 may in fact overlap with minor deviations due to localized variations in the capacitances of each CAP sensor 325.

During operation, the baseline capacitance of CAP sensors 325 may drift due to a variety of environmental factors, such as temperature changes, dynamically changing parasitic capacitances, localized disturbances, electromagnetic interference ("EMI"), or otherwise. This drift is illustrated by the wandering traces S1 to S4. Furthermore, chart 400 illustrates a user activation of CAP sensor 325A sometime between the samplings of CAP sensor 325A at time T6 and time T8. In one embodiment, when the measured capacitance value of CAP sensor 325A crosses the activation threshold, the user activation of CAP sensor 325A is registered or acknowledged by software or hardware logic coupled to capacitance measurement circuitry 305.

Figure 5:
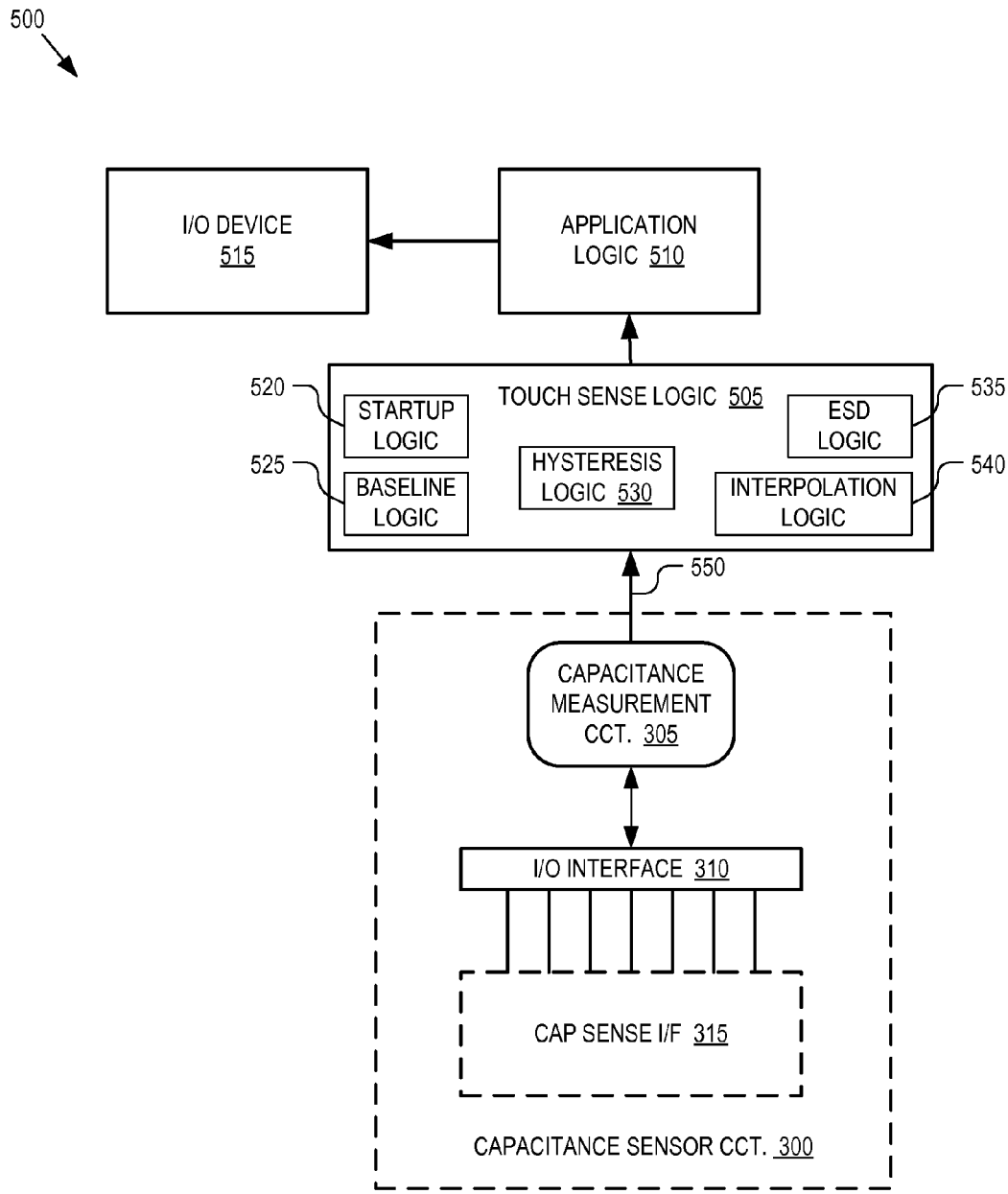
FIG. 5 is a functional block diagram illustrating a system for improved capacitive touch sensing, in accordance with an embodiment of the invention.

FIG. 5 is a functional block diagram illustrating a system 500 for improved capacitive touch sensing, in accordance with an embodiment of the invention. The illustrated embodiment of system 500 includes capacitance sensor circuit 300, touch sense logic 505, application logic 510, and I/O device 515. The illustrated embodiment of touch sense logic 505 includes a startup logic component 520, a baseline logic component 525, a hysteresis logic component 530, an electrostatic discharge ("ESD") component 535, and an interpolation logic component 540.

During operation, capacitance measurement circuit 305 outputs a signal 550 being indicative of a capacitance or capacitance change of a selected one of CAP sensors 325 within capacitance sense interface 315. In one embodiment, capacitance measurement circuit 305 includes a relaxation oscillator and signal 550 is representative of a frequency change Δf or a period change ΔP of the oscillator circuit. In one embodiment, signal 550 is the output of a gated clock signal that forms a counter. The number of gated clock cycles counted by the counter is then related to the capacitance on the selected CAP sensor 325 in a similar manner as the frequency change Δf or the period change ΔP is related to the capacitance on the selected CAP sensor 325, discussed above.

Touch sense logic 505 may be implemented entirely in software or firmware (e.g., machine readable instructions), entirely in hardware (e.g., application specific integrated circuit, field programmable gate array, etc.), or some combination of both. Touch sense logic 505 analyzes signal 550 to compensate for various environmental factors (e.g., temperature drift), filter noise, reject false activation events (e.g., reject ESD events), interpolate higher resolution from capacitance sense interface 315, and compensate for various other user interactions with the capacitance sense interface 315. Touch sense logic 505 analyzes signal 550 to determine whether an actuations of CAP sensors 325 should be registered (acknowledged) as valid touch events or rejected (masked) as false touch events. While analyzing signal 550, the touch sense logic may implement one or more of the techniques discussed below.

Application logic 510 represents various user applications that may receive input from capacitance sensor circuit 300, use the input to manipulate application data, and generate output for I/O device 515. I/O device 515 may represent any type of I/O device including a display, a network interface card, an audio port, various peripheral devices, and the like.

A) Baseline Drift Compensation Technique

Figure 6:
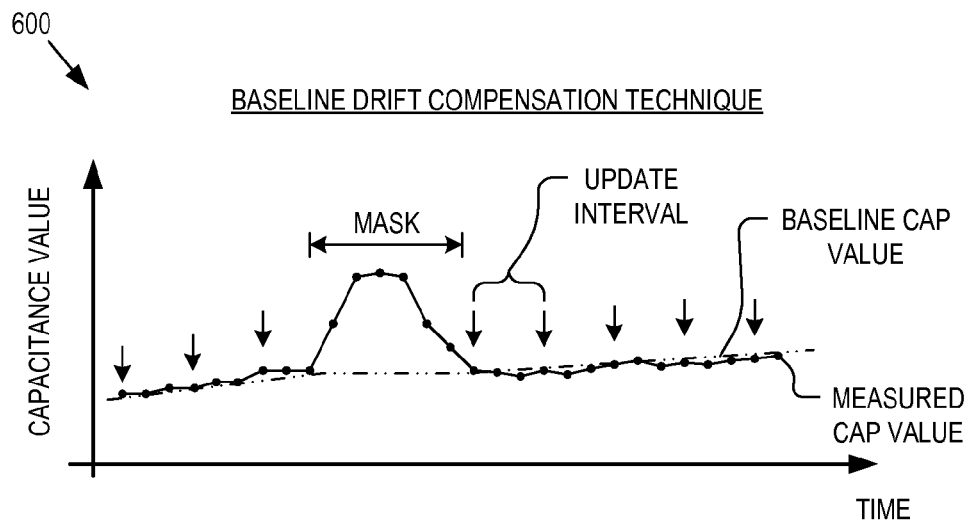
FIG. 6 is a chart illustrating a baseline drift compensation technique for improved capacitive touch sense operation, in accordance with an embodiment of the invention.

FIG. 6 is a chart 600 illustrating a baseline drift compensation technique for improved capacitive touch sense operation, in accordance with an embodiment of the invention. In general, capacitance sensor circuit 300 measures a change in capacitance from a deactivated state to an activated state of a selected CAP sensor 325. In one embodiment, baseline logic 525 monitors the difference between the current value of signal 550 and a historical or baseline value. Thresholds for determining whether an activation event has in fact occurred are set related to these historical or baseline values. Measured capacitance values that pass over the activation threshold are considered to be touch events. Accordingly, it is important to accurately track the baseline capacitance values associated with CAP sensors 325 should they drift over time.

Background (or "parasitic") capacitance may change slowly as a result of environmental factors (temperature drift, electrostatic charge build up, etc.). The activation threshold values should be adjusted to compensate for this background capacitance and other factors. This may be done by monitoring signal 550 in real-time, and updating the baseline capacitance value on a regular basis based on the actual capacitance values measured during each sampling cycle. In one embodiment, the baseline capacitance value for each CAP sensor 325 is tracked and updated using a weighted moving average. For example, the weighted moving average may apply a 0.25 weight to the presently measured capacitance value and a 0.75 weight to the historical baseline capacitance value. Of course, other weights may be applied. In one embodiment, infinite impulse response ("IIR") filters are used to filter signal 550 in real-time and make computation of the weighted moving average efficient.

As illustrated in FIG. 6, when an activation is sensed, the baseline capacitance value is held steady so that the elevated values due to the user interaction do not skew the baseline capacitance value calculation. Accordingly, during activations the baseline update algorithm is disabled and the measured capacitance values masked so as to hold the baseline capacitance value steady until the CAP sensor is deactivated.

The rate at which the baseline capacitance values are updated can be set as part of the system design and even updated by users at a later date. The automatic update rate or interval may also be set by the user to compensate for expected environmental variance. In the event that environmental changes are too rapid, the automatic update rate can be adjusted at run-time to compensate. In one embodiment, the update interval may be set to every Nth sampling (e.g., N=5), where N can be any positive integer.

The baseline capacitance values for each CAP sensor 325 may be adjusted individually or as part of a sensor group (e.g., sensor groups 340 or 350). Tracking and updating baseline capacitance values for each CAP sensor 325 allows different environmental effects to be compensated in each CAP sensor 325 independently. Alternatively, a group baseline capacitance value compensation enables variations to be averaged over a group of CAP sensors 325. Accordingly, an embodiment of the invention enables convenient group compensation of baseline capacitance values and the update rate to be applied to a group of CAP sensors 325. This may be useful for groups of CAP sensors 325 that are physically adjacent to each other in capacitance sense interface 315.

B) Finger On Startup Detection Technique

Figure 7:
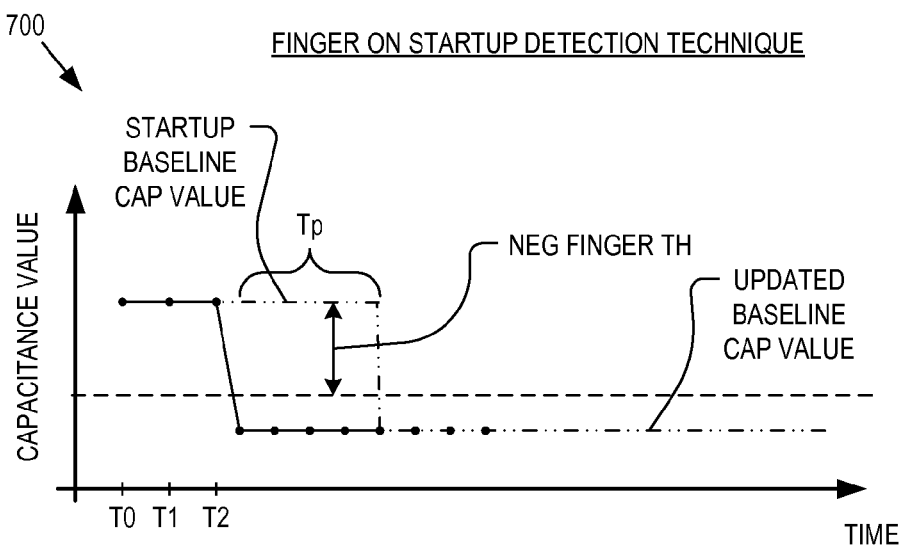
FIG. 7 is a chart illustrating a finger on startup detection technique for improved capacitive touch sense operation, in accordance with an embodiment of the invention.

FIG. 7 is a chart 700 illustrating a finger on startup detection technique for improved capacitive touch sense operation, in accordance with an embodiment of the invention. In one embodiment, the baseline capacitance values discussed above are initialized upon booting or starting system 500. If during the initialization procedures (e.g., time T0 to T1 in FIG. 7), one or more CAP sensors 325 are actuated by a user (e.g., the user has his finger on one or more CAP sense buttons), it may be necessary to detect this condition and quickly update the startup baseline capacitance values. After the user removes the activation (time T2 in FIG. 7), the measured capacitance value of signal 550 will change to a negative value below the startup baseline capacitance value. Simply relying on the baseline logic 525 to slowly track down the startup baseline capacitance value using the weighted moving average can take too long, during which time user interaction with capacitance sense interface 315 will not be recognized. Accordingly this finger on startup condition should be quickly recognized and compensated.

In one embodiment, the finger on startup condition is determined by startup logic 520, if the measured capacitance values of signal 550 cross a negative finger threshold below the startup baseline capacitance value and remains below it for a predetermined period of time (Tp). If this condition is found to be valid, then the startup baseline capacitance value is immediately updated by averaging the capacitance values measured after signal 550 dropped below the negative finger threshold. In one embodiment, the predetermined period of time Tp is a fixed number of sampling cycles (e.g., five sampling cycles).

C) Activation With Hysteresis Technique

Figure 8:
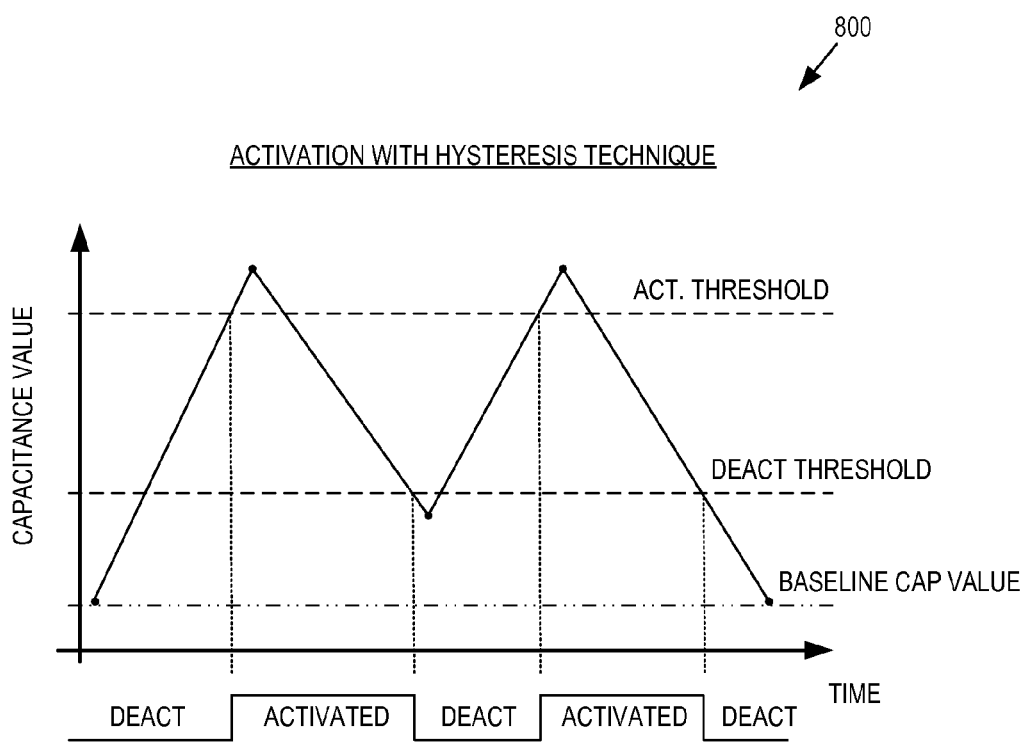
FIG. 8 is a chart illustrating an activation with hysteresis technique for improved capacitive touch sense operation, in accordance with an embodiment of the invention.

FIG. 8 is a chart 800 illustrating activation of CAP sensors 325 using hysteresis for improved capacitive touch sense operation, in accordance with an embodiment of the invention. Depending on the scan rate of a capacitance sense interface 315, rapid repeat activation of the CAP sensors 325 may result in measured capacitance values that do not return all the way to the baseline capacitance value between activations. Unless compensated for, rapid repeat activations may not be detected.

To compensate for rapid repeat activations, hysteresis logic 530 may add hysteresis to the detection algorithm by applying two separate thresholds for determining when a selected CAP sensor 325 is activated and when the selected CAP sensor 325 is deactivated. As illustrated in FIG. 8, hysteresis logic 530 may add an activation threshold and a lower deactivation threshold. When a measured capacitance value cross the activation threshold, the corresponding CAP sensor 325 is registered as "activated." When the measured capacitance value falls below the deactivation threshold, the corresponding CAP sensor 325 is deemed "deactivated." In this manner, the measured capacitance value need not return all the way to the baseline capacitance value before an activation is deemed deactivated, nor does the measured capacitance value need to return to the baseline capacitance value to register a subsequent activation.

D) ESD Compensation Technique

Figure 9A:
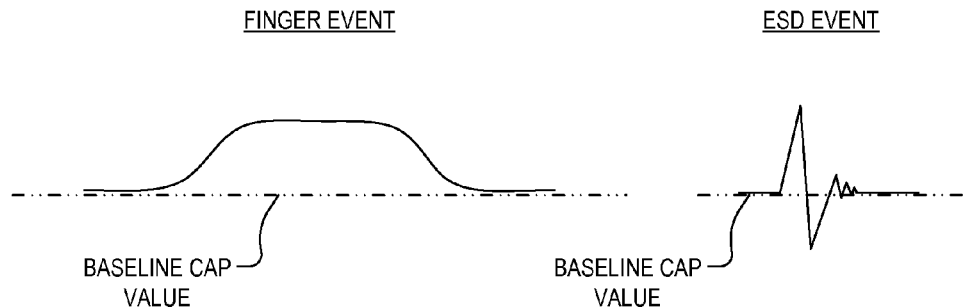
FIG. 9A illustrates typical capacitance profiles for a finger event and an electrostatic discharge ("ESD") event on a capacitance sensor, in accordance with an embodiment of the invention.

FIG. 9A illustrates typical measured profiles for a finger event and an ESD event on CAP sensors 325, in accordance with an embodiment of the invention. As can be seen, the measured capacitance values rise and fall gradually as a user finger (or other conductive device) approaches and departs capacitance sense interface 315. In contrast, an ESD event is typified by a rapid spike above the baseline capacitance value, followed by a rapid drop below the baseline capacitance value followed by a ringing or transients with rapidly declining envelope.

Figure 9B:
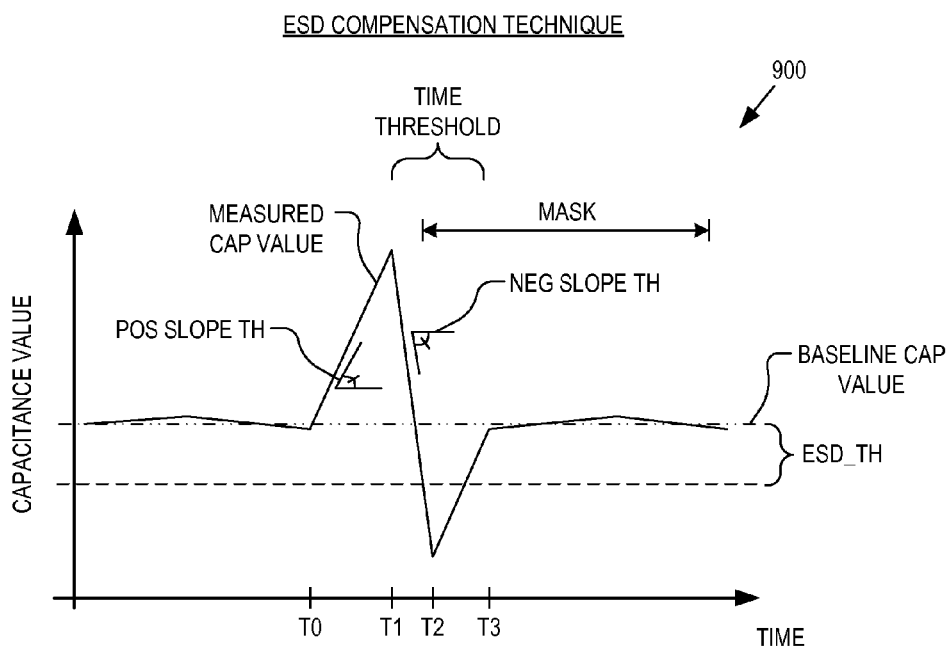
FIG. 9B is a chart illustrating an ESD compensation technique for improved capacitive touch sense operation, in accordance with an embodiment of the invention.

FIG. 9B is a chart 900 illustrating an ESD compensation technique for rejecting ESD events, in accordance with an embodiment of the invention. The user interface environment has substantial opportunity for interruption from ESD events. In order to prevent false activation, signal 550 is evaluated by ESD logic 535. The nature of ESD events is to inject large fast transients into the measured capacitance values, as illustrated in FIG. 9A. ESD logic 535 can reject these ESD events by quickly recognizing these transients and masking the false event for a period of time.

ESD logic 535 can recognize an ESD event by monitoring the slope between consecutive samplings of the measured capacitance values (e.g., calculating the derivative of traces S0 to S4 is real-time) and determining whether the measured capacitance values cross an ESD threshold below the baseline capacitance value. When the derivative value is significantly faster than typical of human activation, an activation may be rejected as an ESD event. In one embodiment, ESD logic 535 determines that an ESD event has occurred if: (1) the slope of the measured capacitance value turns positive and has a magnitude greater than a positive slope threshold (POS_SLOPE_TH), (2) the slope of the measured capacitance value then turns negative and has a magnitude greater than a negative slope threshold (NEG_SLOPE_TH), and (3) the measured capacitance value cross an ESD threshold (ESD_TH) below the baseline capacitance value. ESD logic 535 may apply a fourth requirement that conditions (1), (2), and (3) occur within a predetermined time threshold. If ESD logic 535 determines these conditions are valid, then the activation event is rejected as a false activation or ESD event and all activation on the particular CAP sensor 325 will be rejected or masked for a period of time.

E) Variable Resolution Via Interpolation

Some application logic 510 may require the use of a sliding switch, such as radial slider interface 320 or linear slider interface 330. In many cases the resolution desired is much finer than is physically possible by simply using a greater number of smaller CAP sensors 325. There may also be a desire for detecting greater resolution or granularity than there are physical CAP sensors in the physical array of CAP sensors. In one embodiment, interpolation logic 540 includes detection algorithms to assess the signal strength on each CAP sensor in the array and map the measured values onto a user selected number of CAP sensors (e.g., interpolation). Typical examples include mapping eight linearly spaced CAP sensors 325 onto a 0 to 100 scale, mapping twenty CAP sensors 325 onto a 0 to 256 scale, or mapping eight CAP sensors 325 onto six separate capacitance sense buttons. The calculations may be done with fractional fixed point for efficiency in a limited capability microcontroller.

Figure 10:
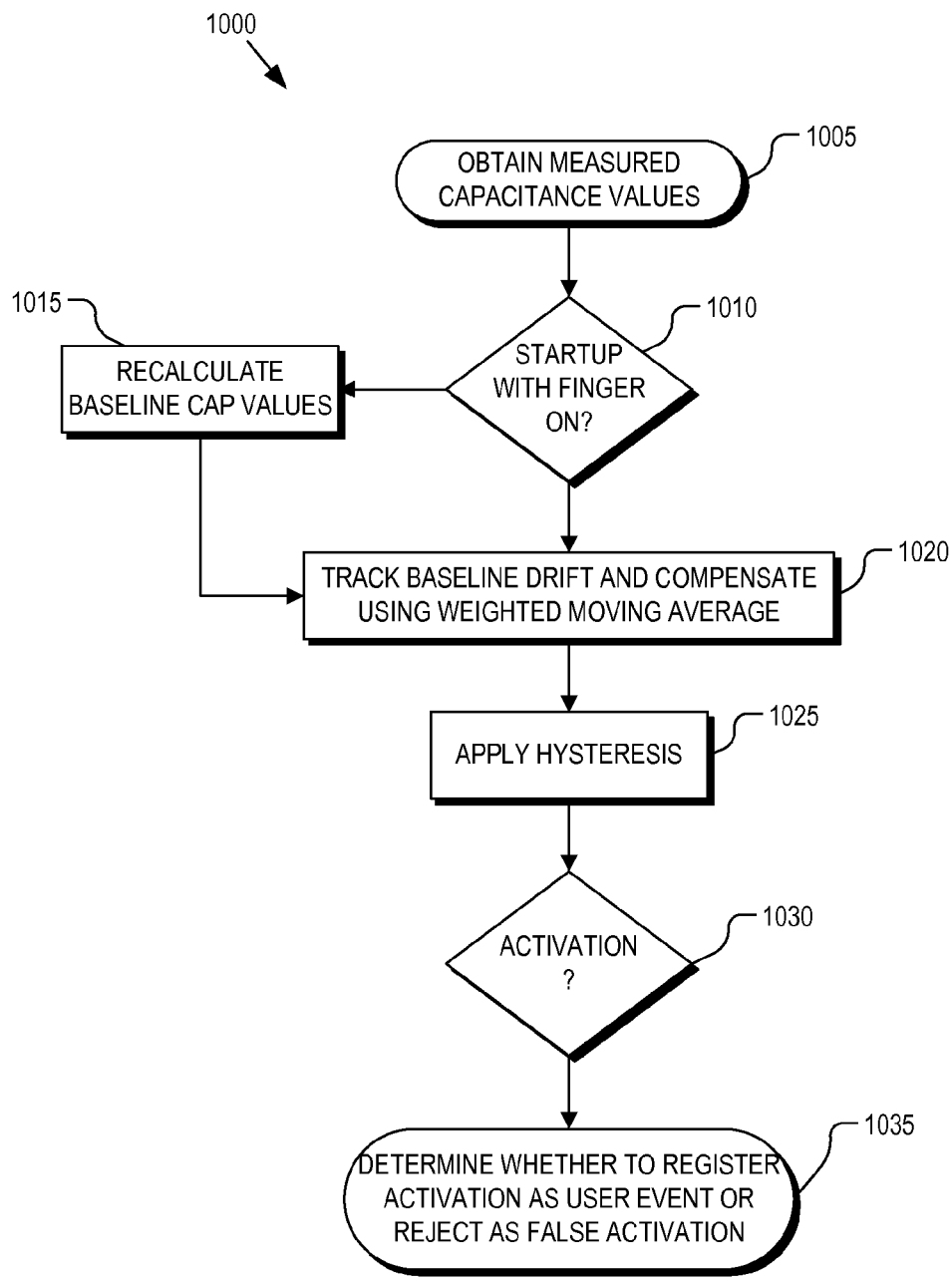
FIG. 10 is a flow chart illustrating a process for improved capacitive touch sensing using a capacitance sense interface, in accordance with an embodiment of the invention.
Figure 11:
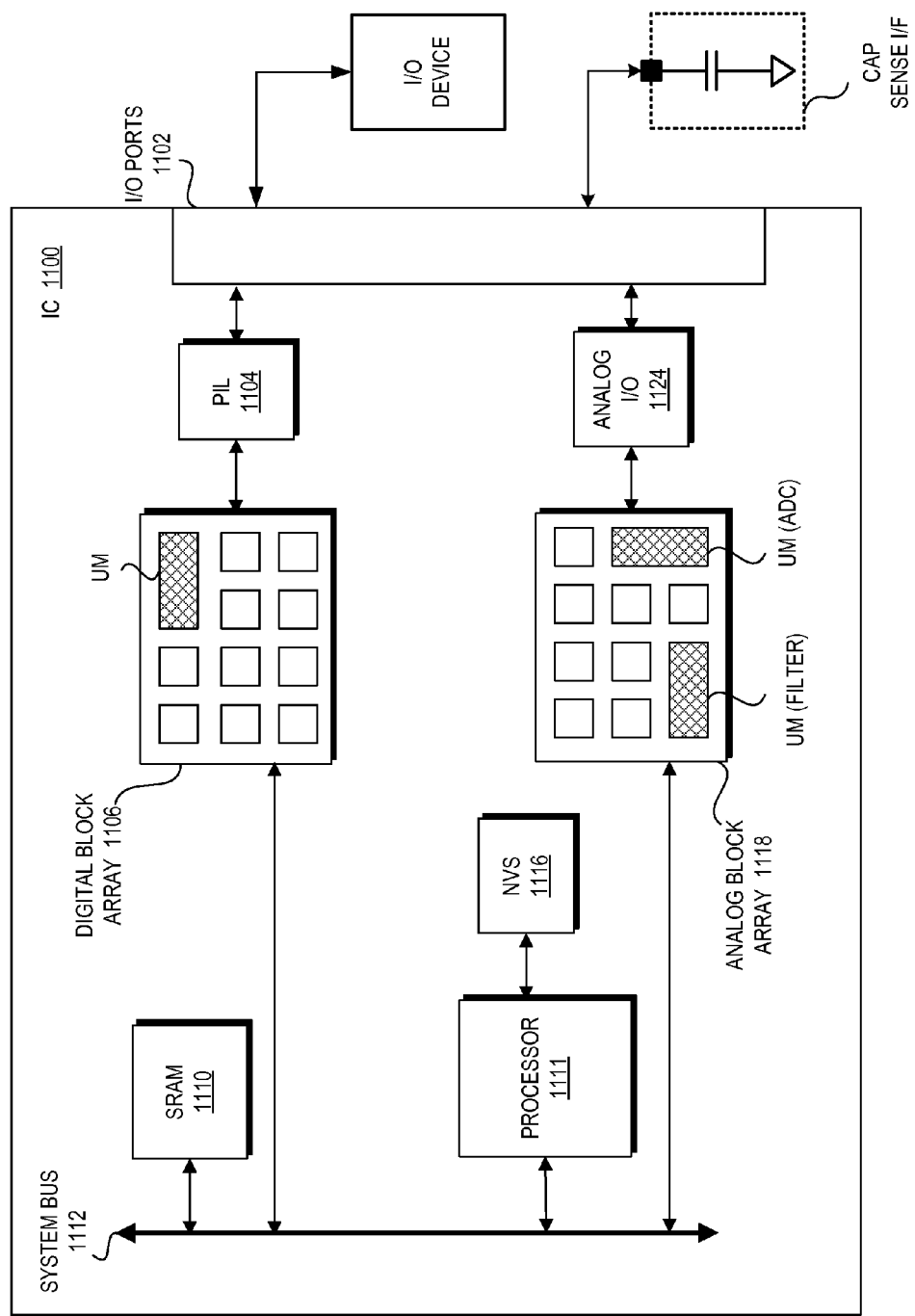
FIG. 11 illustrates a demonstrative integrated circuit for implementing an embodiment of the invention.

FIG. 10 is a flow chart illustrating a process 1000 for improved capacitive touch sensing using system 500, in accordance with an embodiment of the invention. The order in which some or all of the process blocks appear in process 1000 below should not be deemed limiting. Rather, one of ordinary skill in the art having the benefit of the present disclosure will understand that some of the process blocks may be executed in a variety of orders or even in parallel.

In a process block 1005, capacitance sensor circuit 300 commences measuring the capacitance values associated with CAP sensors 325. In one embodiment, I/O interface 310 is configured to scan each CAP sensor 325 in sequence to time share capacitance measurement circuit 305 across all CAP sensors 325. Accordingly, the measured capacitance values for all CAP sensors 325 may be obtained in process block 1005 before continuing on with the rest of process 1000, or process 1000 may be executed in its entirety after obtaining a single measured capacitance value, before moving to the next CAP sensor 325 in the sequence.

In a decision block 1010, touch sense logic 505 determines whether system 500 was started with a user finger on capacitance sense interface 315. If so, then the baseline capacitance values for CAP sensors 325 are recalculated in process block 1015. In a process block 1020, touch sense logic 505 tracks the baseline capacitance value(s) of CAP sensors 325 in capacitance sense interface 315. If the baseline capacitance values drift, then a weighted moving average may be applied to update the baseline average and track the baseline drift. In a process block 1025, hysteresis is applied to signal 550 to determine whether any of CAP sensors 325 have been activated or deactivated (decision block 1030). Finally, in a process block 1035, touch sense logic 505 evaluates signal 505 to determine whether the activation should be acknowledged or registered as a valid user activation or rejected as a false activation. Rejecting the activation as a false activation may include identifying noise (e.g., ESD events) in signal 505 and compensating (e.g., reject ESD events).

FIG. 6 illustrates a demonstrative integrated circuit ("IC") 1100 implemented using an embodiment of system 500. IC 1100 illustrates a Programmable System on a Chip (PSoC™) microcontroller by Cypress Semiconductor Corporation. The illustrated embodiment of IC 1100 includes programmable input/output ("I/O") ports 1102, at least a portion of which correspond to I/O interface 310. I/O ports 1102 are coupled to Programmable Interconnect and Logic ("PIL") 1104 which acts as an interconnect between I/O ports 1102 and a digital block array 1106. Digital block array 1106 may be configured to implement a variety of digital logic circuits (e.g., DAC, digital filters, digital control systems, etc.) using configurable user modules ("UMs"). Digital block array 1106 is further coupled to a system bus 1112.

Static Random Access Memory ("SRAM") 1110 and processor 1111 are also coupled to system bus 1112. Processor 1111 is coupled to non-volatile storage ("NVS") 1116 which may be used to store firmware (e.g., touch sense logic 540).

An analog block array 1118 is coupled to system bus 1112. Analog block array 1118 also may be configured to implement a variety of analog circuits (e.g., ADC, analog filters, comparators, current sources, etc.) using configurable UMs. Analog block array 1118 is also coupled to an analog I/O unit 1124 which is coupled to I/O ports 1102. In one embodiment, I/O interface 310 is included within analog I/O 1124. Various subcomponents of capacitance measurement circuit 305 may be implemented with various UMs of digital clock array 1106 and/or analog block array 1118 or the subcomponents may be stand alone components.

The processes explained above are described in terms of computer software and hardware. The techniques described may constitute machine-executable instructions embodied within a machine (e.g., computer) readable storage medium, that when executed by a machine will cause the machine to perform the operations described. Additionally, the processes may be embodied within hardware, such as an application specific integrated circuit ("ASIC") or the like.

System 500 may be incorporated into IC 1100, as well as, various other integrated circuits. Descriptions of system 500 may be generated and compiled for incorporation into other integrated circuits. For example, behavioral level code describing system 500, or portions thereof, may be generated using a hardware descriptive language, such as VHDL or Verilog, and stored to a machine-readable storage medium. Furthermore, the behavioral level code can be compiled into register transfer level ("RTL") code, a netlist, or even a circuit layout and stored to a machine-readable storage medium. The behavioral level code, the RTL code, the netlist, and the circuit layout all represent various levels of abstraction to describe system 500.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in the following claims should not be construed to limit the invention to the specific embodiments disclosed in the specification. Rather, the scope of the invention is to be determined entirely by the following claims, which are to be construed in accordance with established doctrines of claim interpretation.

What is claimed is:

1. A method comprising:
   measuring capacitance values of a capacitance sense element;
   monitoring a rate of change of the measured capacitance values; and
   rejecting an activation of the capacitance sense element as a non-touch event if conditions indicative of the non-touch event are sensed, wherein the conditions indicative of the non-touch event comprise the rate of change of the measured capacitance values having a magnitude greater than a threshold level, wherein the threshold level is indicative of a maximum rate of change of a touch event.

2. The method of claim 1, further comprising analyzing the measured capacitance values to determine a baseline capacitance value for the capacitance sense element, wherein the analyzing comprises:

tracking the baseline capacitance value for the capacitance sense element;
calculating a weighted average based on a current capacitance value measured on the capacitance sense element and the capacitance values that were previously measured on the capacitance sense element; and
updating the baseline capacitance value with the weighted average.

3. The method of claim 2, further comprising filtering the measured capacitance values using an infinite impulse response (IIR) filter before the calculating the weighted average.

4. The method of claim 1, further comprising:
analyzing the measured capacitance values to determine a baseline capacitance value for the capacitance sense element;
accepting the activation of the capacitance sense element as a touch event; and
maintaining the baseline capacitance value when the activation of the capacitance sense element is accepted as the touch event to not skew the calculated weighted average.

5. The method of claim 1, wherein the threshold level is a positive threshold and the maximum rate of change is a positive, maximum rate of change of the touch event.

6. The method of claim 1, wherein the threshold level is a negative threshold and the maximum rate of change is a negative, maximum rate of change of the touch event.

7. The method of claim 1, wherein the rejecting the activation comprises masking all activations of the capacitance sense element for a period after sensing the conditions indicative of the non-touch event.

8. The method of claim 1, further comprising
determining if the non-touch event is an electrostatic discharge (ESD) event, wherein the determining comprises:
detecting that the non-touch event has conditions indicative of an ESD event, wherein the conditions indicative of the ESD event include at least one of the following:
the rate of change of the measured capacitance values turning positive and having a first magnitude greater than a positive threshold,
the rate of change of the measured capacitance values turning negative and having a second magnitude greater than a positive threshold, or
the measured capacitance values crossing an ESD threshold below a baseline capacitance value.

9. The method of claim 1, further comprising:
analyzing the measure capacitance values to determine that the capacitance sense element has been activated when the measured capacitance values cross an activation threshold; and
analyzing the measured capacitance values to determine that the capacitance sense element has been deactivated when the measured capacitance values cross a deactivation threshold.

10. The method of claim 9, further comprising analyzing the measured capacitance values to determine a baseline capacitance value for the capacitance sense element, wherein the analyzing the measured capacitance value to determine the baseline capacitance value further comprises holding the baseline capacitance value substantially steady during activation events of the capacitance sense element.

11. The method of claim 1, further comprising
updating a baseline capacitance value based at least in part upon a weighted moving average of the measured capacitance values.

12. The method of claim 1, further comprising:
analyzing the measured capacitance values to determine a baseline capacitance value for the capacitance sense element; and
analyzing the measured capacitance values to determine whether the measured capacitance values are below the baseline capacitance value by a threshold value for a predetermined period; and
updating the baseline capacitance value based on the measured capacitance values measured after the measured capacitance values are below the baseline capacitance value by the threshold value.

13. A method comprising:
measuring capacitance values of a capacitance sense element;
monitoring a rate of change of the measured capacitance values; and
distinguishing between an activation of the capacitance sense element by a conductive object and a non-touch event when the rate of change of the measured capacitance values exceeds a magnitude greater than a threshold level, the threshold level indicative of a maximum rate of change of a touch event.

14. The method of claim 13, further comprising analyzing the measured capacitance values to determine a baseline capacitance value for the capacitance sense element.

15. The method of claim 14, wherein the analyzing comprises:
tracking the baseline capacitance value for the capacitance sense element;
filtering the measured capacitance values using an infinite impulse response (IIR) filter;
calculating a weighted average based on a current capacitance value measured on the capacitance sense element and the capacitance values that were previously measured on the capacitance sense element; and
updating the baseline capacitance value with the weighted average.

16. An apparatus comprising:
a capacitance measurement circuit to be coupled to a capacitance sense element, wherein the capacitance measurement circuit is configured to measure capacitance values of the capacitance sense element; and
event logic coupled to the capacitance measurement circuit, the event logic to measure a rate of change of the measured capacitance values and to distinguish between an activation of the capacitance sense element by a conductive object and a non-touch event when the rate of change of the measured capacitance values exceeds a magnitude greater than a threshold level, the threshold level indicative of a maximum rate of change of a touch event.

17. The apparatus of claim 16, wherein the event logic is further configured to
determine if the non-touch event is an electrostatic discharge event (ESD) event when at least one of the following conditions is detected:
the rate of change of the measured capacitance values turning positive and having a first magnitude greater than a positive threshold,
the rate of change of the measured capacitance values turning negative and having a second magnitude greater than a positive threshold, or the measured capacitance values crossing an ESD threshold below a baseline capacitance value.

18. The apparatus of claim 16, further comprising hysteresis logic coupled to the event logic to determine whether capacitance sense element has been activated based on whether the measured capacitance values cross an activation threshold value and to determine whether the capacitance sense element has been deactivated based on whether the measured capacitance values cross a deactivation threshold.

19. The apparatus of claim 16, further comprising baseline logic coupled to analyze the measured capacitance values to determine whether a baseline capacitance value associated with the capacitance sense element has drifted and to update the baseline capacitance value.

* * * * *